(12) United States Patent
Matsui

(10) Patent No.: US 8,699,656 B2
(45) Date of Patent: Apr. 15, 2014

(54) SHIFT REGISTER

(71) Applicant: Panasonic Corporation, Osaka (JP)

(72) Inventor: Masafumi Matsui, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/717,797

(22) Filed: Dec. 18, 2012

(65) Prior Publication Data

US 2013/0170606 A1    Jul. 4, 2013

Related U.S. Application Data

(63) Continuation of application No. PCT/JP2011/007355, filed on Dec. 28, 2011.

(51) Int. Cl.
*G11C 19/00* (2006.01)

(52) U.S. Cl.
USPC .................................. 377/64; 377/78; 377/79

(58) Field of Classification Search
None
See application file for complete search history.

(56) References Cited

U.S. PATENT DOCUMENTS

| | | | |
|---|---|---|---|
| 5,222,082 A | 6/1993 | Plus | |
| 7,627,076 B2 | 12/2009 | Tobita | |
| 8,175,216 B2 | 5/2012 | Tobita | |
| 8,232,954 B2* | 7/2012 | Han | 345/100 |
| 8,284,149 B2* | 10/2012 | Yoon et al. | 345/100 |
| 8,284,150 B2* | 10/2012 | Han | 345/100 |
| 2007/0195920 A1 | 8/2007 | Tobita | |
| 2008/0062097 A1* | 3/2008 | Jeong et al. | 345/84 |
| 2010/0141641 A1 | 6/2010 | Furuta et al. | |
| 2010/0166136 A1 | 7/2010 | Tobita | |
| 2010/0309356 A1 | 12/2010 | Ihara et al. | |
| 2011/0157145 A1 | 6/2011 | Toyoshima et al. | |
| 2012/0044132 A1* | 2/2012 | Koga et al. | 345/100 |
| 2012/0076256 A1 | 3/2012 | Yonemaru et al. | |
| 2012/0213323 A1* | 8/2012 | Tsai | 377/64 |
| 2013/0028370 A1* | 1/2013 | Kikuchi et al. | 377/64 |

FOREIGN PATENT DOCUMENTS

| | | |
|---|---|---|
| JP | 6-505605 | 6/1994 |
| JP | 2007-257813 | 10/2007 |
| JP | 2010-152967 | 7/2010 |
| JP | 2011-034620 | 2/2011 |
| WO | 2009/034749 | 3/2009 |
| WO | 2010/146738 | 12/2010 |

OTHER PUBLICATIONS

Byung Seong Bae et al., "Level Shifter Embedded in Drive Circuits With Amorphous Silicon TFTs", IEEE Transactions on Electron Devices, vol. 53, No. 3, Mar. 2006, pp. 494-498.
U.S. Appl. No. 13/717,855 to Masafumi Matsui, filed Dec. 18, 2012.

* cited by examiner

*Primary Examiner* — Tuan T Lam
(74) *Attorney, Agent, or Firm* — Greenblum & Bernstein, P.L.C.

(57) ABSTRACT

A shift register includes unit circuits connected in multiple stages, each of the unit circuits includes: a final buffer unit having an output transistor; and a signal A generating unit which supplies a first signal to a gate of the output transistor, the signal A generating unit includes: a capacitor; a transistor which switches conduction and non-conduction between the gate the output transistor and one of electrodes of the capacitor by a voltage from a clock signal line; a transistor which switches conduction and non-conduction between the other of the electrodes of the capacitor and the clock signal line by a voltage from an input line; and a transistor having a gate connected to a fixed power supply line, and which switches conduction and non-conduction between the one electrode of the first capacitor and the input line.

11 Claims, 16 Drawing Sheets

Period 1

Period 2

Period 3

Period 4

Period 2

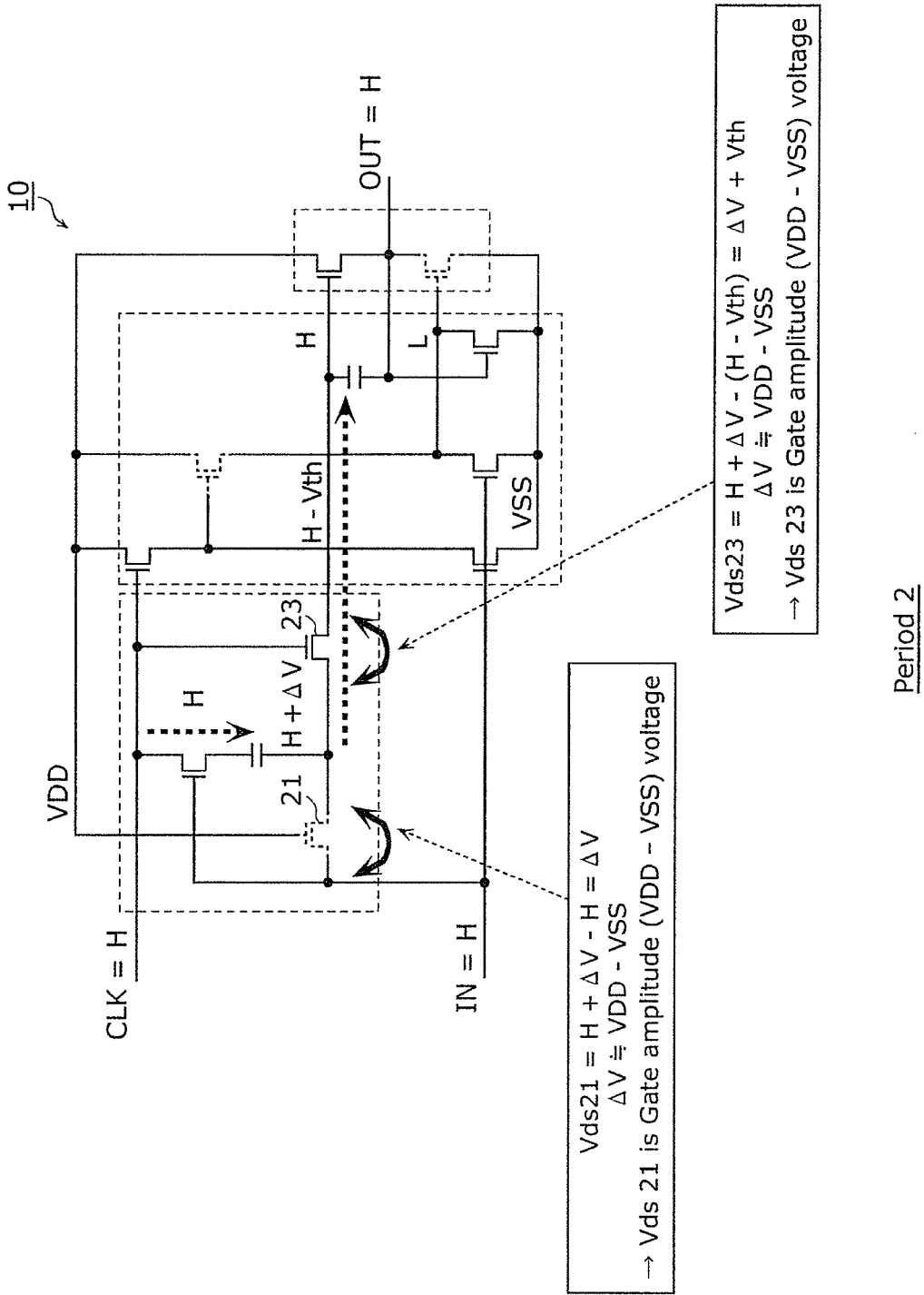

SHIFT REGISTER

CROSS REFERENCE TO RELATED APPLICATION

This is a continuation application of PCT Patent Application No. PCT/JP2011/007355 filed on Dec. 28, 2011, designating the United States of America. The entire disclosure of the above-identified application, including the specification, drawings and claims is incorporated herein by reference in their entirety.

TECHNICAL FIELD

One or more exemplary embodiments disclosed herein relate generally to shift registers, and particularly to a shift register capable of securing an output period longer than a horizontal period.

BACKGROUND ART

Thin-film transistors (TFT) made of amorphous silicon for selecting pixels are used in a pixel circuit in an active-matrix liquid crystal display or an organic EL display. In order to drive the selecting TFTs, a driver circuit is provided at a periphery of the display. The driver circuit is composed of a logic device for outputting a driving pulse for turning the selecting TFT on or off.

The selecting TFTs are provided at intersections of scanning lines and data lines. The driver circuit turns on the selecting TFTs in the pixel row selected through the scanning lines, such that data signals from the signal line is written on each of the pixels, or the pixels emit light. Shift register is a driver circuit which outputs a selection signal for each of the selected pixel rows. The patent literature 1 discloses a specific circuit configuration of the shift register composed of only TFTs having single polarity.

FIG. 11A is a block configuration diagram of a shift resister disclosed in the patent literature 1. The conventional shift register disclosed in FIG. 11A is used as a scanning line selector for the liquid crystal display. The shift register includes multiple stages having nearly identical circuit configuration connected by cascade connection. An output signal from an upper stage is an input signal of the shift register, and the output signal from the shift register is the input signal to another shift register in the lower stage. Three clock signal lines are connected to a clock signal generator 522, and two of the three clock signal lines are connected to each stage.

FIG. 11B is a specific circuit configuration diagram of the stage included in the shift register disclosed in the patent literature 1. The stage 510 in FIG. 11B includes TFTs 516 to 521. All of the TFTs are of the same conduction type. FIG. 12A is an example of a driving timing chart for a case in which the shift register disclosed in the patent literature 1 uses two horizontal periods as an output period. The stage 510 converts the input signal and outputs the output signal from the output 1 by a bootstrapping operation using a clock signal C1. A starting timing for outputting a turn-on voltage which is a selection signal from the output 1 is when the input signal and the clock signal C1 are on, and an ending timing for the output is when the clock signal C1 changes to the off state and the clock signal C3 are on. In the same manner, in the stage 510 which is on the second row, the starting timing for outputting the turn-on voltage from an output 2 is when the signal from the output 1 and the clock signal C2 are on, and an ending timing for the output is when the clock signal C2 is off and the clock signal C1 is on. To put it differently, in the shift register illustrated in the patent literature 1, a scanning line selection with a transfer amount for one horizontal period or for two horizontal periods is enabled by having an on-period for two horizontal periods which is the same as the on-period of the input signal and by using three clock signals having a shift amount for one horizontal period.

CITATION LIST

Patent Literature

[Patent Literature 1] Japanese Unexamined Patent Application Publication (Translation of PCT Application) No. H06-505605

SUMMARY

Technical Problem

However, in the conventional shift register disclosed in the patent literature 1, in order to increase the length of the selection period of the scanning line while maintaining the transfer shift amount for one horizontal period, a clock signal for outputting the turn-on voltage in the period same as the selection period is necessary, since the selection period of the scanning line is limited to the on-period of the clock signal. In addition, in order to secure the transfer shift amount in one horizontal period, it is necessary to add the clock signal. There is another problem that the increase in the clock signals increases the number of lines, resulting in the increase in the frame area on which the driver circuit is provided.

One non-limiting and exemplary embodiment provides a shift register capable of securing an output period longer than the horizontal period of the scanning lines without increasing the clock signal lines, and prevents the increase in the frame area by securing the output period.

Solution to Problem

In one general aspect, the shift register disclosed here feature a shift register including a plurality of unit circuits connected in multiple stages, in which each of the unit circuits includes: an output unit having an output terminal, a first transistor which supplies a first voltage to the output terminal, and a second transistor which supplies a second voltage to the output terminal; a first signal generating unit which supplies a first signal for switching the first transistor between conduction and non-conduction to a gate electrode of the first transistor, based on an input signal which is a signal provided from an output terminal of a unit circuit in a previous stage and a clock signal; and a second signal generating unit which supplies a second signal for switching the second transistor between conduction and non-conduction to a gate electrode of the second transistor, based on the input signal and the clock signal, the first signal generating unit includes: a first capacitor; a third transistor having a gate electrode connected to a clock signal line to which a clock signal is provided, and which switches conduction and non-conduction between the gate electrode of the first transistor and one of electrodes of the first capacitor; a fourth transistor having a gate electrode connected to an input line to which the input signal is provided, and which switches conduction and non-conduction between the other of the electrodes of the first capacitor and the clock signal line; and a fifth transistor having a gate electrode connected to a reference power supply line, and which switches conduction and non-conduction between the one electrode of the first capacitor and the input line.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The shift register according to the present disclosure allows adjustment of the output period without adding clock signal lines, and prevents the increase in the area of the frame region on which the shift register is provided.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 8B illustrates effects of the shift register according to the embodiment 1.

DESCRIPTION OF EMBODIMENT(S)

(Underlying Knowledge of the Present Disclosure)

The inventor found the following problems on the shift register described in the Background.

Figure 12A:
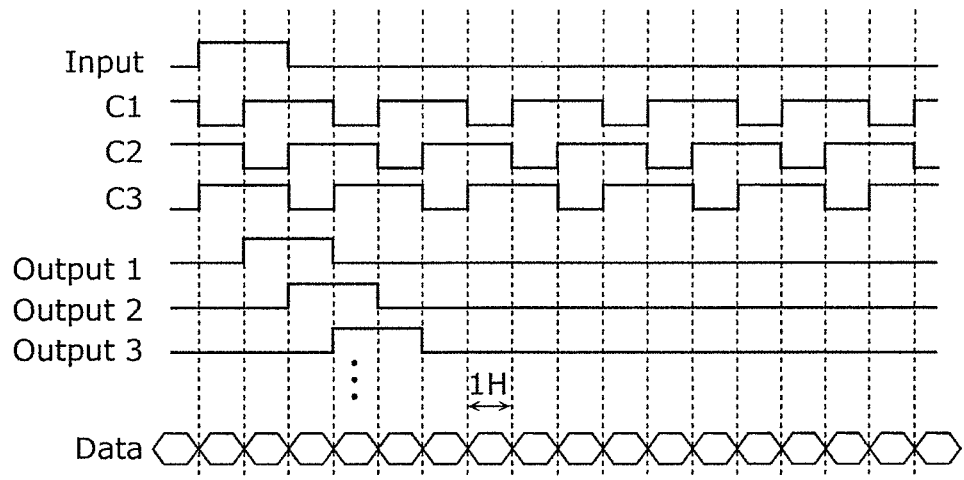
FIG. 12A is an example of a driving timing chart in which the output period of the shift register disclosed in the patent literature 1 ranges two horizontal periods.
Figure 12B:
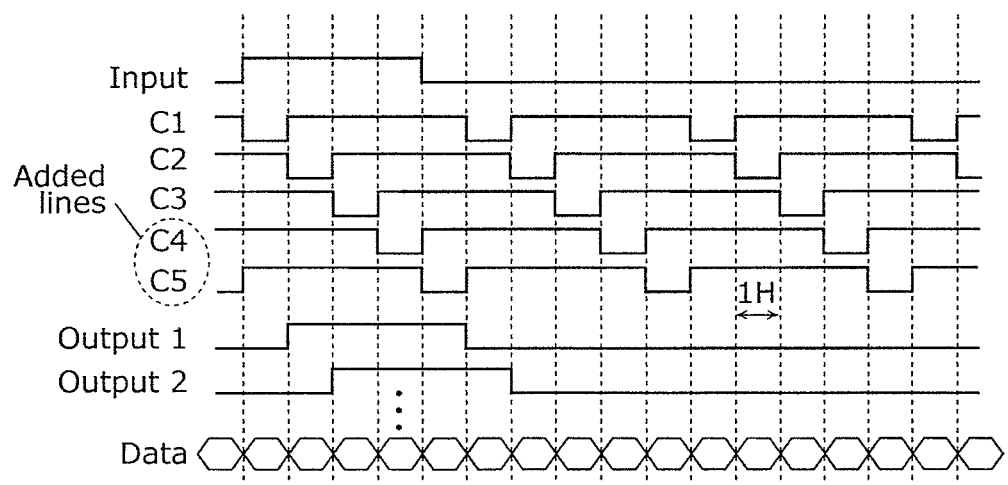
FIG. 12B is an example of a driving timing chart in which the output period of the shift register disclosed in the patent literature 1 ranges four horizontal periods.

FIG. 12B is an example of a driving timing chart for a case in which the shift register disclosed in the patent literature 1 uses four horizontal periods as an output period. As illustrated in FIG. 12B, in order to secure the four horizontal periods as the selection period of the scanning line while maintaining the transfer shift amount of one horizontal period, it is necessary to output n on-voltage in a period identical to the four horizontal periods, and to have five clock signals having a shift amount for one horizontal period are necessary.

Generally, when the size of the display panel increases, the load capacitance on the scanning line increases. Accordingly, there is a case in which an on-period of the selecting TFT is set to be longer than the horizontal period. In contrast, in the conventional shift register disclosed in the patent literature 1, it is necessary to set a clock signal having the output period and to add a clock signal for securing the transfer shift amount in order to secure a long output period for selecting the scanning line. With this, there is a problem that the number of lines increases, increasing the frame area in which the driver circuit is provided.

In order to solve the problem, the shift register according to an aspect of the present disclosure is a shift register including a plurality of unit circuits connected in multiple stages, in which each of the unit circuits includes: an output unit having an output terminal, a first transistor which supplies a first voltage to the output terminal, and a second transistor which supplies a second voltage to the output terminal; a first signal generating unit which supplies a first signal for switching the first transistor between conduction and non-conduction to a gate electrode of the first transistor, based on an input signal which is a signal provided from an output terminal of a unit circuit in a previous stage and a clock signal; and a second signal generating unit which supplies a second signal for switching the second transistor between conduction and non-conduction to a gate electrode of the second transistor, based on the input signal and the clock signal, the first signal generating unit includes: a first capacitor; a third transistor having a gate electrode connected to a clock signal line to which a clock signal is provided, and which switches conduction and non-conduction between the gate electrode of the first transistor and one of electrodes of the first capacitor; a fourth transistor having a gate electrode connected to an input line to which the input signal is provided, and which switches conduction and non-conduction between the other of the electrodes of the first capacitor and the clock signal line; and a fifth transistor having a gate electrode connected to a reference power supply line, and which switches conduction and non-conduction between the one electrode of the first capacitor and the input line.

Conventionally, the signal is provided using the bootstrapping operation from the clock signal line. In contrast, with the configuration described above, the signal output uses a fixed voltage from the reference power supply line. It is possible to secure the output period longer than or equal to the horizontal period by supplying the signal voltage regularly boosted by the first signal generating unit to the gate electrode of the first transistor and by supplying the signal voltage generated by the second signal generating unit to the gate electrode of the second transistor, based on the input signal and the clock signal. With this, the desired output period is adjusted without adding the clock signal line, which prevents increase in the area of the frame region in which the shift register according to the present disclosure is provided. Furthermore, with the configuration of the first signal generating unit, transistors are not connected in series between the reference power supply line and the power supply line having a potential different from the reference power supply line. Accordingly, even if the third to fifth transistors are of the depletion type, it is possible to prevent a flow-through current from the reference power supply line from flowing.

Furthermore, in a shift register according to an aspect of the present disclosure, the first capacitor may hold a potential difference between the clock signal and the input signal when the fourth transistor and the fifth transistor are in a conducting state, a potential in the one electrode of the first capacitor may be boosted using a potential change of the clock signal when the fourth transistor is in the conducting state, and the first signal generating unit may supply, to the first transistor, the first signal obtained by boosting the input signal according to the potential difference and the potential change.

Furthermore, in a shift register according to an aspect of the present disclosure, the second signal generating unit may include: a sixth transistor which switches conduction and non-conduction between a first fixed power supply line and the gate electrode of the second transistor, the first fixed power supply line being for supplying a first fixed voltage corresponding to the first voltage; a seventh transistor having a gate electrode connected to the clock signal line, and which switches conduction and non-conduction between the first fixed power supply line and a gate electrode of the sixth transistor; an eighth transistor having a gate electrode connected to the input line, and which switches conduction and non-conduction between the gate electrode of the sixth transistor and a second fixed power supply line for supplying a second fixed voltage corresponding to the second voltage; a ninth transistor having a gate electrode connected to the input line, and which switches conduction and non-conduction between the gate electrode of the second transistor and the second fixed power supply line; and a tenth transistor having a gate electrode connected to the gate electrode of the first transistor through a second capacitor, and which switches conduction and non-conduction between the gate electrode of the second transistor and the second fixed power supply line, and the second signal generating unit supplies, to the gate electrode of the second transistor, the second signal for setting the second transistor to a non-conducting state at least in a period when the first transistor is in a conducting state by the first signal supplied by the first signal generating unit.

With this, it is possible to secure the output period longer than or equal to the horizontal period by sampling and holding the signal boosted by the first signal generating unit, by the capacitor in the second signal generating unit.

Furthermore, in a shift register according to an aspect of the present disclosure, the first to the tenth transistors are n-type thin-film transistors, for example.

Furthermore, in a shift register according to an aspect of the present disclosure, the first to the tenth transistors are p-type thin-film transistors, for example.

With these configurations, only the transistors of single polarity are used. This simplifies the fabrication process of the shift register, improving the fabrication yield.

Furthermore, a shift register according to an aspect of the present disclosure may further include a level shifter circuit which is provided between a gate electrode of the third transistor and the clock signal line, and shifts a level of a signal voltage of the clock signal and provides the level-shifted signal voltage to the gate electrode of the third transistor.

Since the signal voltage level transferred from the first signal generating unit is dependent on the gate voltage of the third transistor, the level shifter circuit boosts the gate voltage of the third transistor at the time of transfer. With this, the transferred signal voltage level is increased, allowing the reduction of the on-resistance in the first transistor which is a buffer TFT. Accordingly, the transient characteristics of the output signal OUT is improved, improving the transfer efficiency of the signal.

Furthermore, in a shift register according to an aspect of the present disclosure, the level shifter circuit includes: an input terminal connected to the clock signal line and to which an input pulse voltage of the clock signal is applied; a third capacitor; an eleventh transistor having a source electrode and a drain electrode which are provided between the input terminal and one of electrodes of the third capacitor, and a gate electrode connected to the other of the electrodes of the third capacitor; a twelfth transistor having a source electrode and a drain electrode provided between the input terminal and the other electrode of the third capacitor; a signal generating unit which generates a signal for switching the twelfth transistor from a conducting state to a non-conducting state and to supply the generated signal to a gate electrode of the twelfth transistor, in a period when the input pulse voltage is provided to the input terminal; and an output terminal connected to the gate electrode of the eleventh transistor and for providing a voltage of the other electrode of the third capacitor converted as a result of the twelfth transistor being in the non-conducting state in the period as an output pulse voltage.

With this, a dedicated power supply line for the level-shift operation is not necessary. Thus, it is possible to reduce the line space and load on an external circuit.

Furthermore, in the shift register according to an aspect of the present disclosure, the eleventh transistor and the twelfth transistor are n-type thin-film transistors, for example.

Furthermore, in the shift register according to an aspect of the present disclosure, the eleventh transistor and the twelfth transistor are p-type thin-film transistors, for example.

With these configurations, only the transistors of single polarity are used. This simplifies the fabrication process of the shift register, improving the fabrication yield.

Furthermore, in the shift register according to an aspect of the present disclosure, the reference power supply line may be for supplying a first fixed voltage corresponding to the first voltage.

Furthermore, in the shift register according to an aspect of the present disclosure, the reference power supply line may be for supplying a fixed voltage having an absolute value smaller than the first voltage.

With this, when boosting and transferring the input signal, it is possible to set the source-drain voltages of the third transistor and the fifth transistor to be smaller than the gate amplitude. Thus, it is possible to reduce the load on the third and fifth transistors, improving reliability of the shift register.

The following shall specifically describe a shift register according to an aspect of the present disclosure with reference to the drawings.

Note that, the following embodiments are specific examples in the present disclosure. Numbers, shapes, materials, elements, arrangement of the elements and connections between the elements are mere examples, and not intended to limit the scope of the present disclosure. Furthermore, among the elements in the embodiments, elements not recited in an independent claim directed to the most generic concept shall be illustrated as optional elements.

(Embodiment 1)

Figure 1:
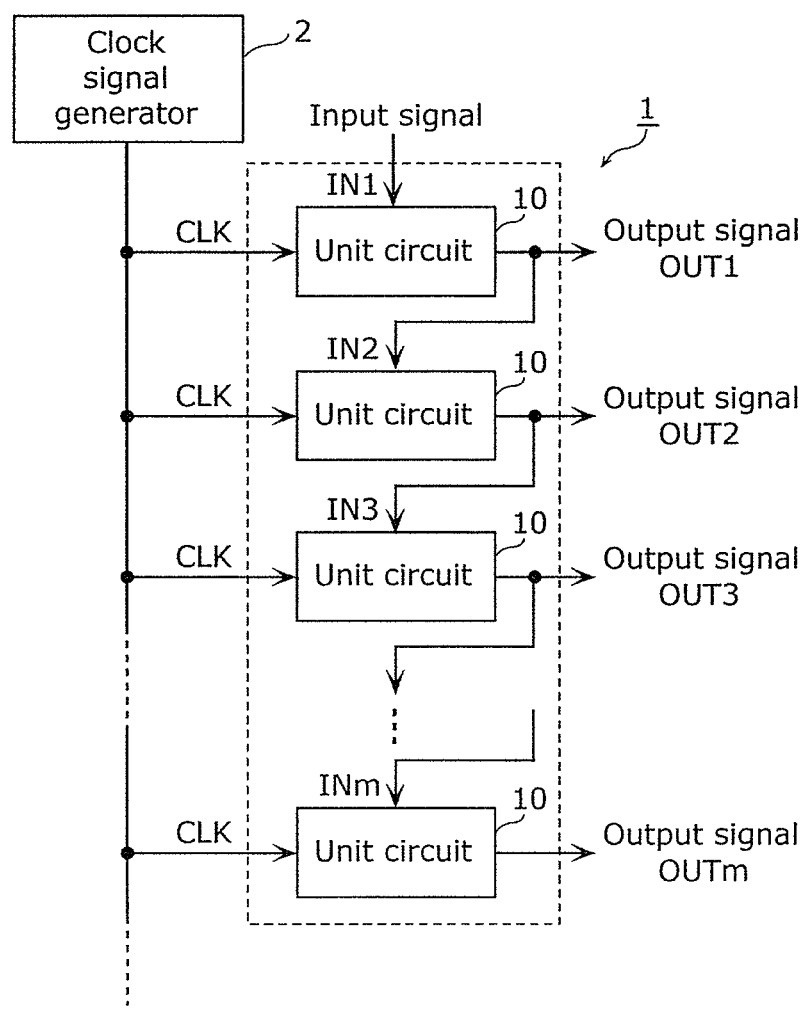
FIG. 1 is a block configuration diagram of a shift register and a peripheral circuit according to the embodiment 1.

FIG. 1 is a block configuration diagram of a shift register and a peripheral circuit around the shift register according to the embodiment 1. In FIG. 1, a shift register 1 and a clock signal generator 2 are illustrated. The shift register 1 includes m unit circuits 10 connected in multiple stages (cascade connection) corresponding to m scanning lines provided for each of m rows of pixel rows in a display panel, and is usually embedded to a gate driver circuit. The gate driver circuit is provided, for example, in a frame region at a periphery of the display panel.

The unit circuit 10 in the first row receives an input of clock signal CLK output from the clock signal generator 2 and the input signal IN1 with a predetermined timing, and outputs an output signal OUT1 having a same output period as an on-voltage output period of the input signal IN1 (hereafter referred to as an output period) with a delay of a half of a clock cycle from the input signal IN1. The unit circuit 10 in the second row receives an input of the clock signal CLK and an input signal IN2 which is the same signal as the output signal OUT with the predetermined timing, and outputs an output signal OUT2 having the same output period as the output period of the input signal IN1 with a delay of a half of the clock cycle from the output signal OUT1. Accordingly, the unit circuit 10 in the k-th row receives input of the clock signal CLK and an input signal INk which is the same signal as an output signal OUT(k−1) with the predetermined timing, and outputs an output signal OUTk having a same output period as the output period of the input signal IN1 with a delay of a half clock cycle from the output signal OUT (k−1).

With the configuration described above, in the shift register 1 according to the present disclosure, it is not necessary to increase the number of clock signal lines even when the selection period of the scanning line is set to be longer than one horizontal period. Accordingly, it is possible to prevent the increase in the frame area by securing the output period. The following shall describe the configuration and the operation of the unit circuit 10.

Note that, an input signal having the output period longer than a half of the cycle of the clock signal is obtained by inputting the clock signal to a conversion circuit composed of a counter, a prescaler, and others.

Figure 2:
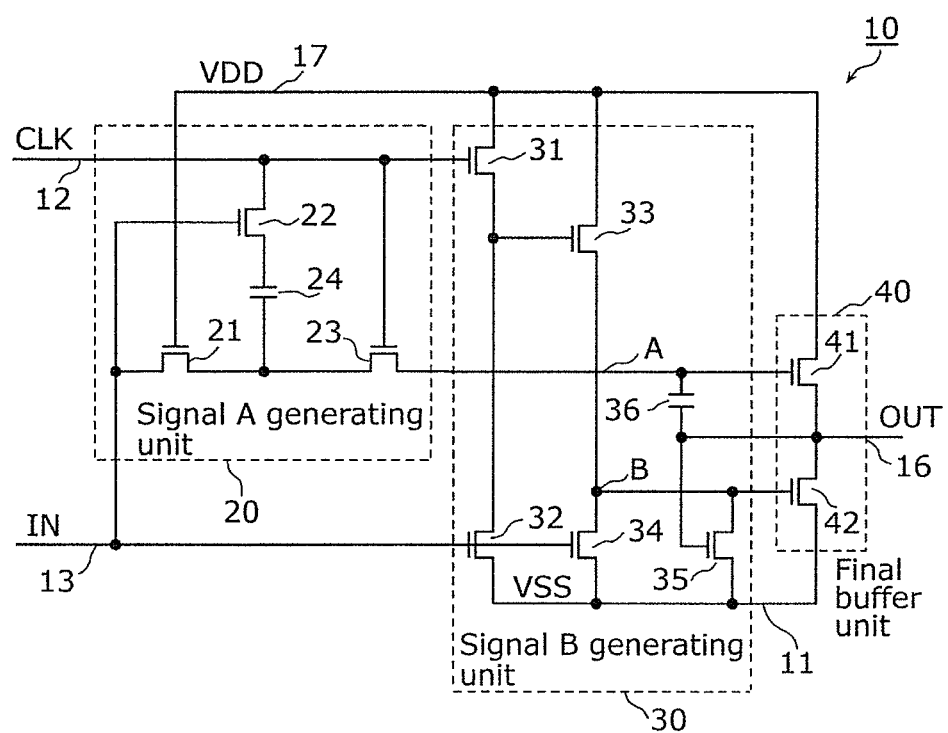
FIG. 2 is a circuit configuration diagram illustrating an example of a unit circuit according to the embodiment 1.

FIG. 2 is a circuit configuration diagram illustrating an example of a unit circuit according to the embodiment 1. The unit circuit 10 in FIG. 2 includes a signal A generating unit 20, a signal B generating unit 30, and a final buffer unit 40.

A fixed power supply line 17 is a reference power supply line set to a power supply voltage VDD corresponding to a voltage applied to the scanning line when the scanning line is selected. A reference power supply line 11 is set to a reference voltage VSS corresponding to a voltage applied to the scanning line when the scanning line is not selected. An input line 13 is connected to an output line 16 in the unit circuit 10 of a previous stage, and the output signal OUT from the unit circuit 10 in the previous stage is supplied to the input line 13 as the input signal IN.

The final buffer unit 40 is an output unit including an output terminal and output transistors 41 and 42.

The output transistor 41 is the first transistor having a drain electrode connected to the fixed power supply line 17, a source electrode connected to the output terminal through the output line 16, and a gate electrode connected to the signal A generating unit 20 through a line A. With this, the output transistor 41 is set to be in the conducting state according to a voltage in the line A, and supplies a first voltage corresponding to the power supply voltage VDD to the output terminal.

The output transistor 42 is the second transistor having a drain electrode connected to the output terminal through the output line 16, a source electrode connected to the reference power supply line 11, and a gate electrode connected to the signal B generating unit 30 through a line B. With this, the output transistor 42 is set to be in the conducting state according to a voltage at the line B, and supplies a second voltage corresponding to a reference voltage VSS to the output terminal.

The signal A generating unit 20 is a first signal generating unit including transistors 21, 22, and 23 and a capacitor 24.

The transistor 23 is the third transistor having a gate electrode connected to the clock signal line 12, a drain electrode connected to one of electrodes of the capacitor 24, and a source electrode connected to the gate electrode of the output transistor 41 through the line A.

The transistor 21 is the fourth transistor having a gate electrode connected to the fixed power supply line 17, a drain electrode connected to the input line 13, and a source electrode connected to one of the electrodes of the capacitor 24.

The transistor 22 is the fifth transistor having a gate electrode connected to the input line 13, a drain electrode connected to the clock signal line 12, and a source electrode connected to the other electrode of the capacitor 24.

The capacitor 24 is the first capacitor which has a charge pumping function, that is, which holds a potential difference between the clock signal CLK and the input signal IN when the transistors 21 and 22 are set to be in the conducting state, and boosts the signal voltage to be supplied to the line A according to the potential difference.

With the configuration described above, the signal A generating unit 20 boosts the voltage of the input signal IN so as to prevent attenuation of the input signal IN due to multiple-stage connection of the unit circuits 10, and supplies a first signal for switching the output transistor 41 between conduction and non-conduction to the gate electrode of the output transistor 41, based on the input signal IN. Furthermore, transistors connected in series are not provided between the fixed power supply line 17 and the reference power supply line 11. Accordingly, even if the transistors 21 to 23 are of depletion type, it is possible to prevent flow-through current flowing from the fixed power supply line 17 to the reference power supply line 11 from flowing.

The signal B generating unit 30 is the second signal generating unit including transistors 31 to 35 and a capacitor 36.

The transistor 31 is the seventh transistor having a gate electrode connected to the clock signal line 12, a drain electrode connected to the fixed power supply line 17, and a source electrode connected to the gate electrode of the transistor 33, and which switches the transistor 33 between conduction and non-conduction, according to the clock signal CLK.

The transistor 32 is the eighth transistor having a gate electrode connected to the input line 13, a drain electrode connected to the gate electrode of the transistor 33, and a source electrode connected to the reference power supply line 11, and which switches the transistor 33 between conduction and non-conduction, according to the input signal IN.

The transistor 33 is the sixth transistor having a drain electrode connected to the fixed power supply line 17, a source electrode connected to the gate electrode of the output transistor 42 through the line B, and which switches the output transistor 42 between conduction and non-conduction, according to the conduction state of the transistors 31 and 32.

The transistor 34 is the ninth transistor having a gate electrode connected to the input line 13, a drain electrode connected to a gate electrode of the output transistor 42 through the line B, and a source electrode connected to the reference power supply line 11, and which switches the output transistor 42 between conduction and non-conduction, according to the input signal IN.

The transistor 35 is the tenth transistor having a gate electrode connected to the output terminal through the output line 16, a drain electrode connected to the gate electrode of the output transistor 42 through the line B, and a source electrode connected to the reference power supply line 11, and which switches the output transistor 42 between conduction and non-conduction, according to the output signal OUT.

The capacitor 36 is the second capacitor having one electrode connected to the gate electrode of the output transistor 41 through the line A and the other electrode connected to the output terminal through the output line 16.

With the configuration described above, the signal B generating unit 30 supplies, to the gate electrode of the output transistor 42, a second signal for switching the output transistor 42 between conduction and non-conduction, and holds a voltage between the line A and the gate electrode of the output transistor 41, according to the input signal IN.

Note that, it is preferable that the transistors 21 to 23, 31 to 35, and the output transistors 41 and 42 are composed of n-type TFTs. With this, the process for fabricating the shift register is simplified, improving the fabrication yield.

While the signal has been conventionally output using the bootstrapping operation from the clock signal line, with the circuit configuration of the unit circuits 10 described above, the signal output is changed to an output using the power supply voltage VDD. It is possible to secure an output period longer than or equal to the horizontal period by the capacitor 36 regularly sampling and holding the signal voltage regularly boosted by the signal A generating unit 20, and the signal B generating unit 30 setting the output transistor in a non-conducting state at least in a period when the signal A generating unit 20 outputs the boosted signal voltage. With this, the output period is adjusted to the desired length without adding the clock signal line, which prevents increase in the area of the frame region in which the shift register 1 is provided.

The following shall describe specific operation of the unit circuit 10 with reference to FIG. 3 and FIG. 4A to FIG. 4F.

Figure 3:
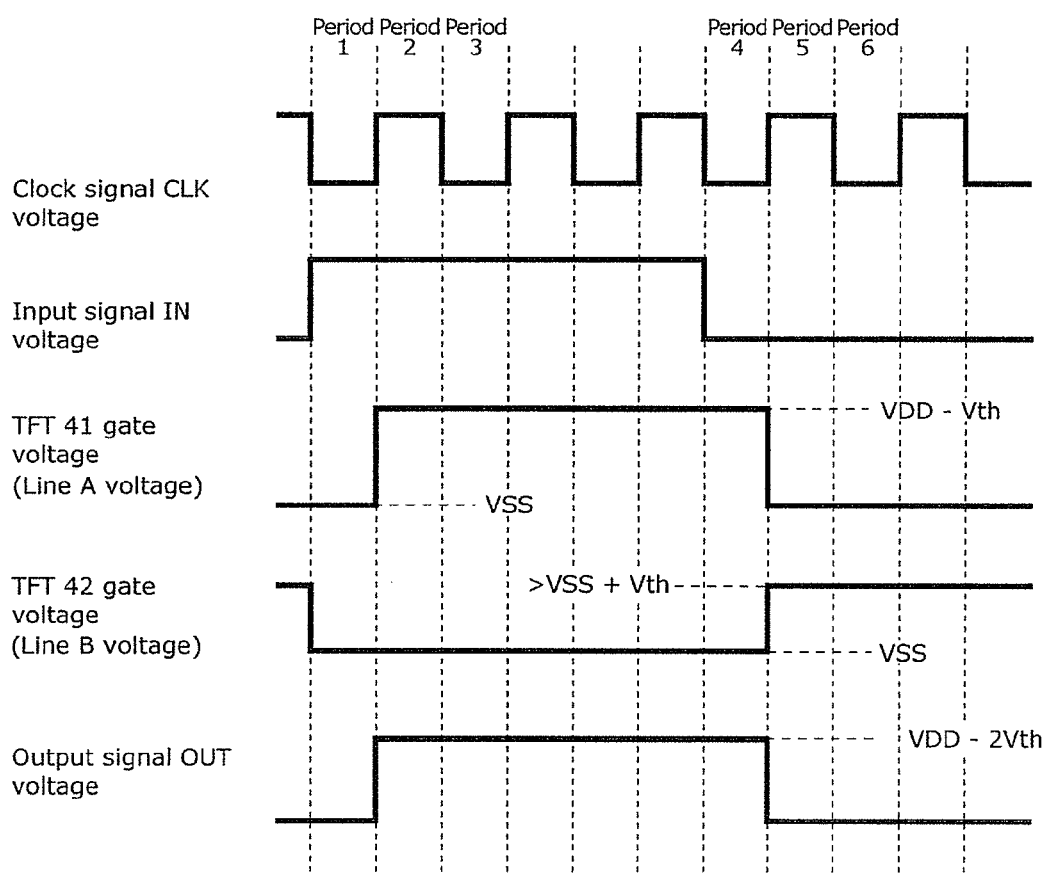
FIG. 3 is a timing chart for driving the shift register according to the embodiment 1.

FIG. 3 is a timing chart for driving the shift register according to the embodiment 1. FIG. 3 illustrates voltage levels of the clock signal CLK, the input signal IN, the line A, the line B, and the output signal OUT for driving the unit circuit 10 included in the shift register 1. The following shall describe the circuit operation particularly focusing on the period 1 to the period 6.

First, in the period 1, the clock signal CLK is set to a low level, and the input signal IN is set to a high level.

Figure 4A:
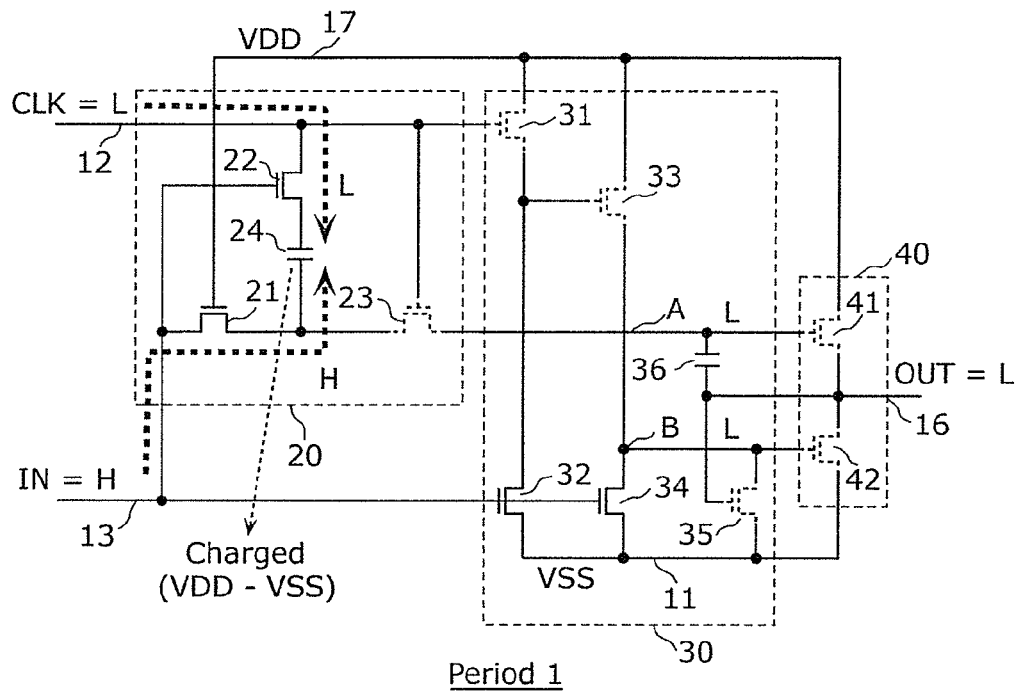
FIG. 4A is a circuit state transition diagram of the unit circuit according to the embodiment 1 in a period 1.

FIG. 4A is a circuit state transition diagram of the unit circuit according to the embodiment 1 in the period 1.

In the period 1, the transistor 22 is set to be in the conducting state when the input signal IN changes to the high level. Since the transistor 22 is set to be in the conducting state and the clock signal CLK is in the low level, the other electrode of the capacitor 24 is set to be in the low level. With this, the one of the electrodes of the capacitor 24 is set to be in the high level, since the transistor 21 is set to be in the conducting state and the input signal IN is in the high level. With the operations described above, a voltage equivalent to the power supply voltage (VDD−VSS) is charged in the capacitor 24. With this, preparation for boosting voltage of the input signal IN is complete.

Next, in the period 2, the clock signal CLK changes to the high level.

Figure 4B:
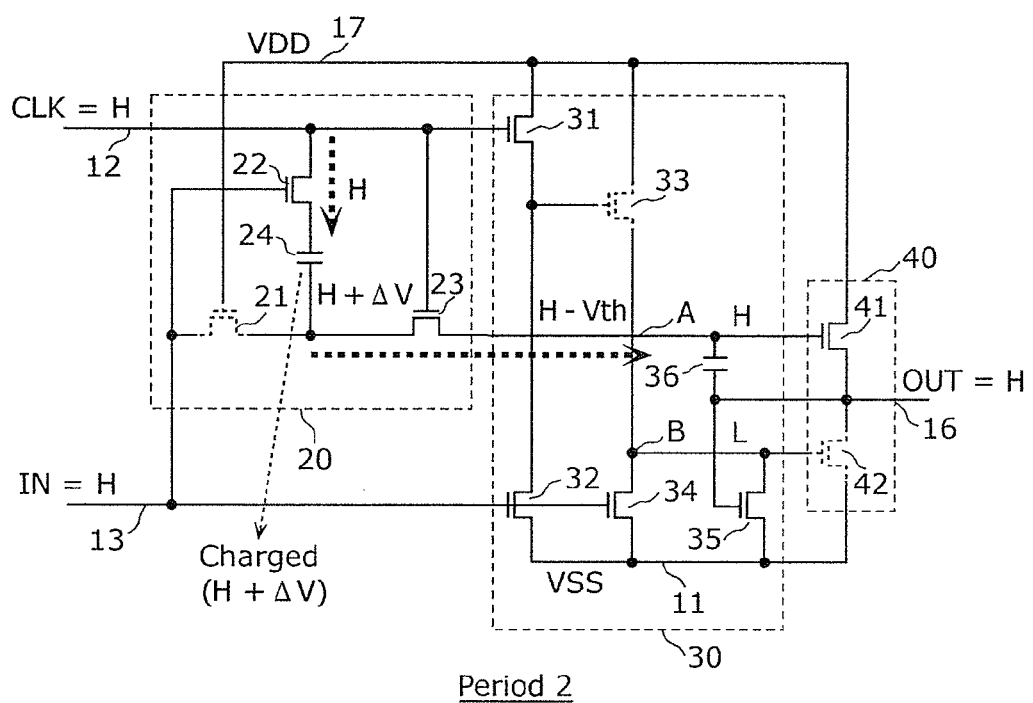
FIG. 4B is a circuit state transition diagram of the unit circuit according to the embodiment 1 in a period 2.

FIG. 4B is a circuit state transition diagram of the unit circuit according to the embodiment 1 in the period 2.

In the period 2, the clock signal CLK changes to the high level, and thus the potential at the other electrode and the one electrode of the capacitor 24 increases. Accordingly, the gate-source voltage (Vgs) of the transistor 21 decreases and the transistor 21 is eventually set to be in the non-conducting state. With the circuit operation described above, the potential at the one electrode of the capacitor 24 is boosted further from the high level (hereafter referred to as H) and becomes (H+ΔV). To put it differently, the signal A generating unit 20 performs a boosting operation in the period 2. In the period 2, the clock signal CLK is set to be in the high level. Accordingly, the transistor 23 is set to be in the conducting state. Here, the voltage at the gate electrode of the transistor 23 is H, and the voltage at the drain electrode is (H+ΔV). With this relationship, the voltage at the source electrode of the transistor 23 is (H−Vth23), where Vth23 denotes a threshold voltage of the transistor 23. Accordingly, the voltage at the line A and the gate voltage in the output transistor 41 is (H−Vth23), and the output transistor 41 is set to be in the conducting state.

Furthermore, in the period 2, when the clock signal CLK is changed to the high level, the transistors 32 and 34 are set to be in the conducting state. Accordingly, the voltage at the gate electrode of the transistor 33 is set to be in L, and the transistor 33 is in the non-conducting state. Since the transistor 34 is in the conducting state and the transistor 33 is in the non-conducting state, the voltage at the line B is determined to be L, and the output transistor 42 is set to be in the non-conducting state.

In the circuit operation in the period 2, the output transistor 41 is in the conducting state, and the output transistor 42 is in the non-conducting state. With this, the voltage of the output signal OUT changes to (H−Vth23−Vth41), which is the first voltage, where Vth 41 denotes the threshold voltage of the output transistor 41.

Here, the effect of the boosting operation by the signal A generating unit 20 in the period 2 shall be described. In the period 2, the voltage of the output signal OUT changes to (H−Vth23−Vth41). Since the output signal OUT becomes the input signal IN to the unit circuit 10 in the next stage, the high-level voltage at the input signal IN in the unit circuit 10 in the next stage is (H−Vth23−Vth41). Here, when there is no boosting operation, (H−Vth23−Vth41) is applied to the drain electrode of the transistor 23. Consequently, there is a case in which a voltage smaller than (H−Vth23) is applied to the line A. Due to repeated voltage transfer by the transistor 23 in each unit circuit 10, the lower the stage of the unit circuit 10 is, the more likely a case in which the output signal OUT does not reach a predetermined voltage level occurs, which leads to malfunction. In contrast, with the boosting operation by the signal A generating unit 20, it is possible to maintain the voltage transferred from the transistor 23 to the line A at a constant value between the unit circuits 10.

More specifically, the shift register 1 causes the capacitor 24 to increase the potential at the one of the electrode of the capacitor 24 by holding the potential difference between the clock signal CLK and the input signal IN when the transistors 21 and 22 are set to be in the conducting state, and by the change in the potential of the clock signal CLK when the transistor 22 is set to be in the conducting state. With this, the signal A generating unit 20 supplies the first signal having the voltage boosted according to the electric potential difference and the change in the potential to the output transistor 41.

Next, in the period 3, the clock signal CLK changes to the low level.

Figure 4C:
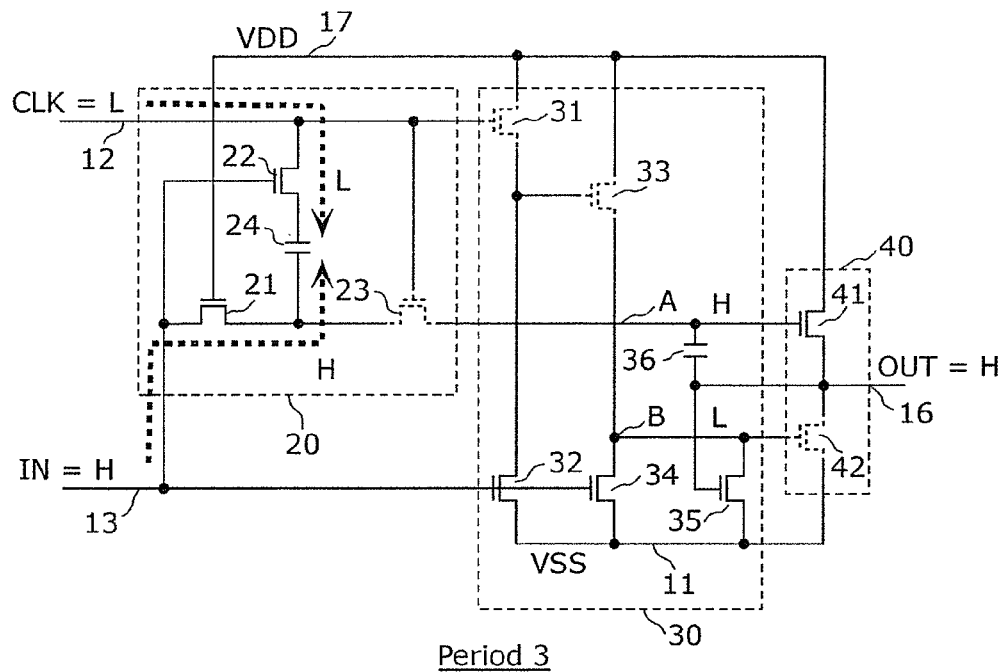
FIG. 4C is a circuit state transition diagram of the unit circuit according to the embodiment 1 in a period 3.

FIG. 4C is a circuit state transition diagram of the unit circuit according to the embodiment 1 in the period 3.

In the period 3, the transistor 22 is set to be in the conducting state when the input signal IN changes to the high level. Since the transistor 22 is set to be in the conducting state and the clock signal CLK is set to be in the low level, the other electrode of the capacitor 24 is in the low level. With this, the one of the electrodes of the capacitor 24 is in the high level, since the transistor 21 is set to be in the conducting state and the input signal IN is in the high level. With the operations described above, a voltage equivalent to the power supply voltage (VDD−VSS) is charged in the capacitor 24. In contrast, since the clock signal CLK is in the low level, the transistor 23 is set to be in the non-conducting state. Accordingly, the voltage at the line A is not updated by the signal A generating unit 20.

In contrast, in the period 3, in the signal B generating unit 30, only the transistor 31 is changed to the non-conducting state since the clock signal CLK is changed to the low level, and the rest of the circuit state remains the same. Accordingly, in the period 3, the signal B generating unit 30 maintains the voltage level of the output signal OUT in the period 2 by the sample and hold function of the capacitor 36.

Next, in the period 4, the clock signal CLK is set to be in the low level, and the input signal IN is set to be in the low level.

Figure 4D:
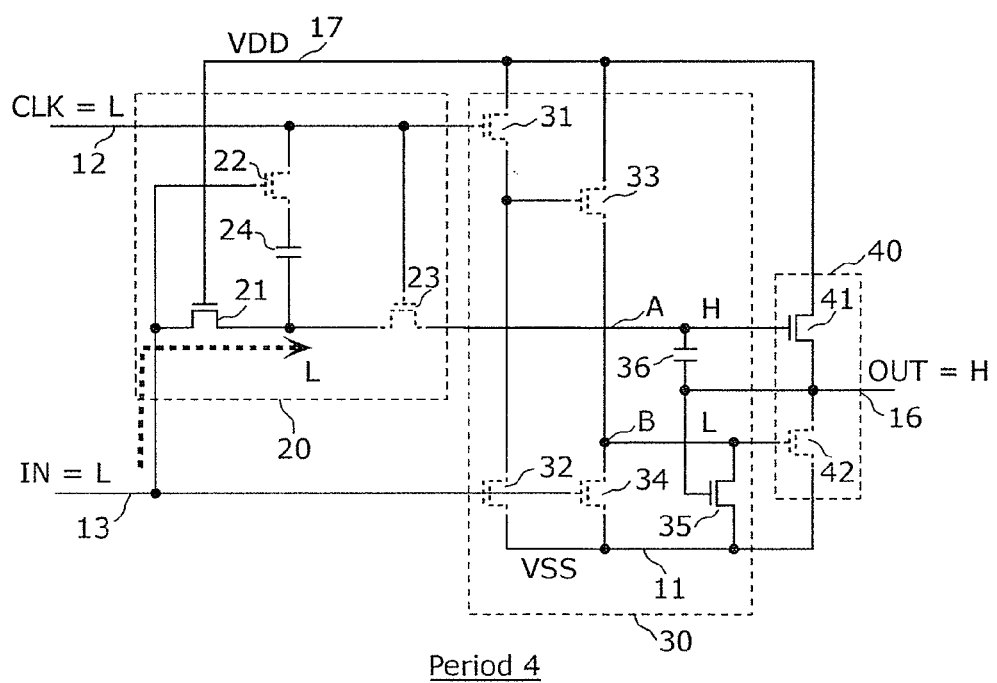
FIG. 4D is a circuit state transition diagram of the unit circuit according to the embodiment 1 in a period 4.

FIG. 4D is a circuit state transition diagram of the unit circuit according to the embodiment 1 in the period 4. In the period 4, the transistor 22 is set to be in the non-conducting state when the input signal IN changes to the low level. Since the transistor 21 is in the conducting state and the input signal IN is in the low level, the one electrode of the capacitor 24 is in the low level. In contrast, since the clock signal CLK is in the low level, the transistor 23 is in the non-conducting state. Accordingly, the voltage at the line A in the period 4 is not updated from the period immediately before.

In contrast, in the period 4, in the signal B generating unit 30, only transistors 32 and 34 are changed to the non-conducting state since the input signal IN changes to the low level. However, since the high voltage in the line A is applied to the gate electrode of the transistor 35 and the transistor 35 is in the conducting state, the gate voltage in the output transistor 42 is maintained to L, and the non-conducting state of the output transistor 42 is maintained. Accordingly, in the period 4, the voltage level of the output signal OUT in the period immediately before is maintained by the sample and hold function of the signal B generating unit 30 to the capacitor 36.

Next, in the period 5, the clock signal CLK changes to the high level.

Figure 4E:
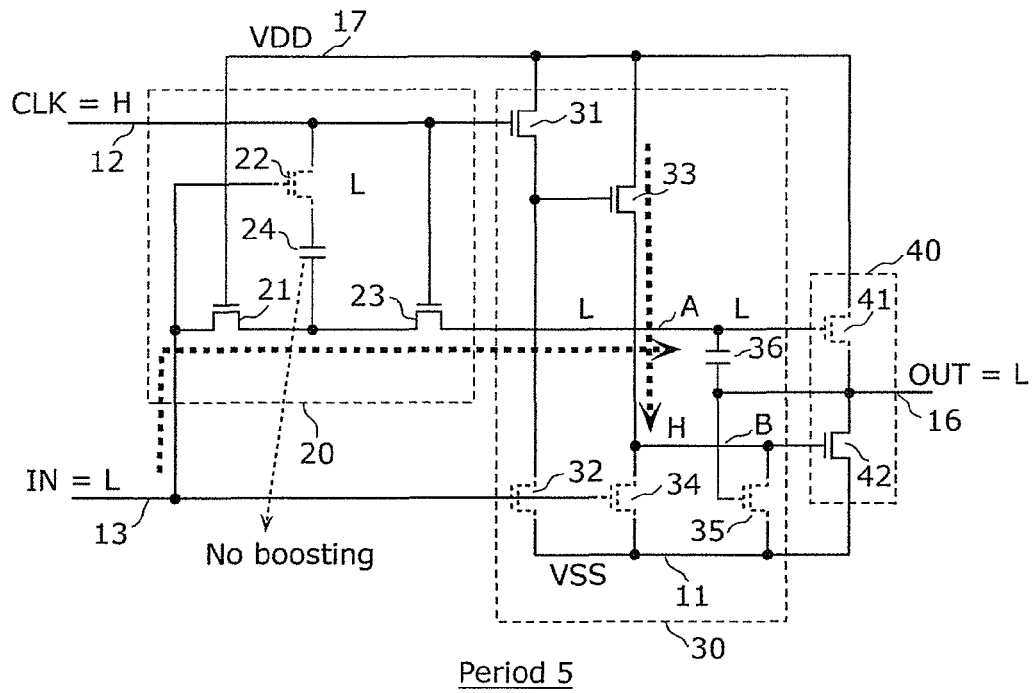
FIG. 4E is a circuit state transition diagram of the unit circuit according to the embodiment 1 in a period 5.

FIG. 4E is a circuit state transition diagram of the unit circuit according to the embodiment 1 in the period 5.

In the period 5, the clock signal CLK is set to be in the high level. Accordingly, the transistor 23 is set to be in the conducting state. Here, there is no boosting operation by the capacitor 24 since the transistor 22 is in the non-conducting state, and thus the conducting state of the transistor 21 is maintained. Accordingly, L of the input signal IN voltage is applied to the line A. Consequently, the output transistor 41 is set to be in the non-conducting state.

Furthermore, in the period 5, since the input signal IN is maintained to the low level, the non-conducting state of the transistors 32 and 34 is maintained. Furthermore, since L of the line A is applied to the gate electrode of the transistor 35, the transistor 35 is in the non-conducting state as well. Since the transistor 33 is in the conducting state and the transistors 34 and 35 are in the non-conducting state, H is applied to the line B. Consequently, the output transistor 42 is set to be in the conducting state.

With the circuit operation in the period 5 described above, the output transistor 41 is set to be in the non-conducting state, and the output transistor 42 is set to be in the conducting state. Accordingly, the voltage of the output signal OUT changes to L.

Next, in the period 6, the clock signal CLK changes to the low level.

Figure 4F:
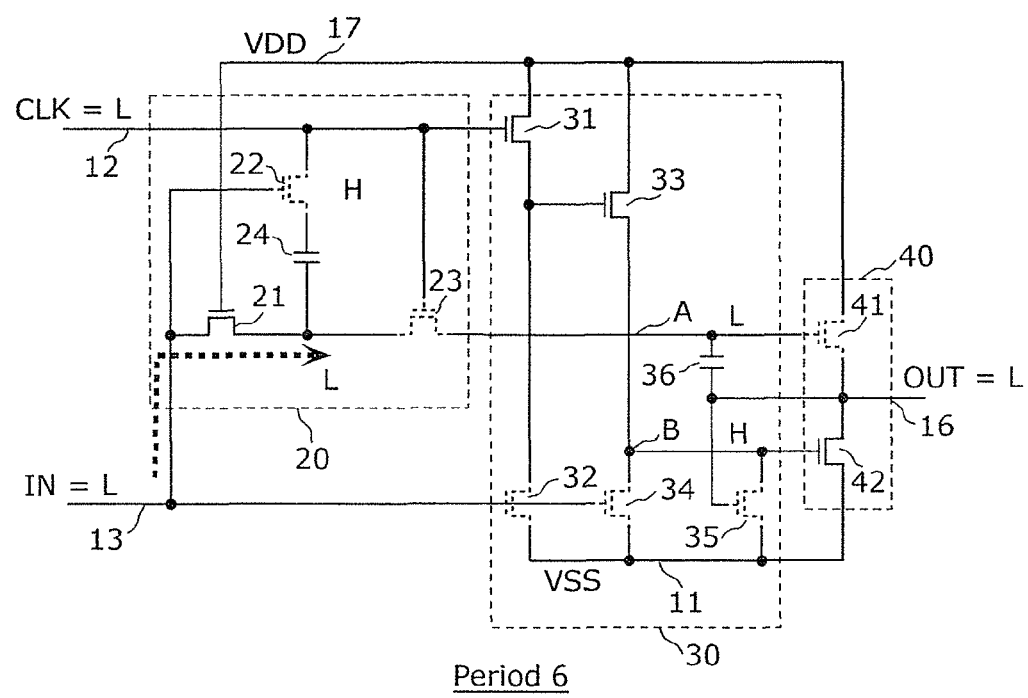
FIG. 4F is a circuit state transition diagram of the unit circuit according to the embodiment 1 in a period 6.

FIG. 4F is a circuit state transition diagram of the unit circuit according to the embodiment 1 in the period 6.

In the period 6, the clock signal CLK changes to the low level. With this, the transistor 23 is set to be in the non-conducting state. Accordingly, the voltage at the line A in the period 6 is not updated from the period 5. Consequently, the non-conducting state of the output transistor 41 is maintained.

Furthermore, in the period 6, since the input signal IN is maintained to the low level and L in voltage at the line A is maintained, the non-conducting state of the transistors 34 and 35 is maintained.

Consequently, the conducting state of the output transistor 42 is maintained. Accordingly, the voltage level of the output signal OUT in the period 5 is maintained in the period 6.

As described above, according to the shift register 1 according to the embodiment 1, the charge pumping operation by the signal A generating unit 20 and the sample and hold operation by the signal B generating unit 30 are performed by the input of the clock signal CLK of one type and the input signal IN for generating the on-voltage in a period identical to the desired output period. With this, the shift register 1 can prevent transfer malfunction without decreasing the signal voltage each time the transfer of the output signal OUT is shifted, allowing an output for the desired output period. Furthermore, it is not necessary to add a clock signal line according to the output period, and it is possible to prevent the increase in the area of the frame region in which the shift register is provided.

(Embodiment 2)

In this embodiment, a shift register in which a level shifter for boosting the clock signal CLK is incorporated shall be described.

Figure 5A:
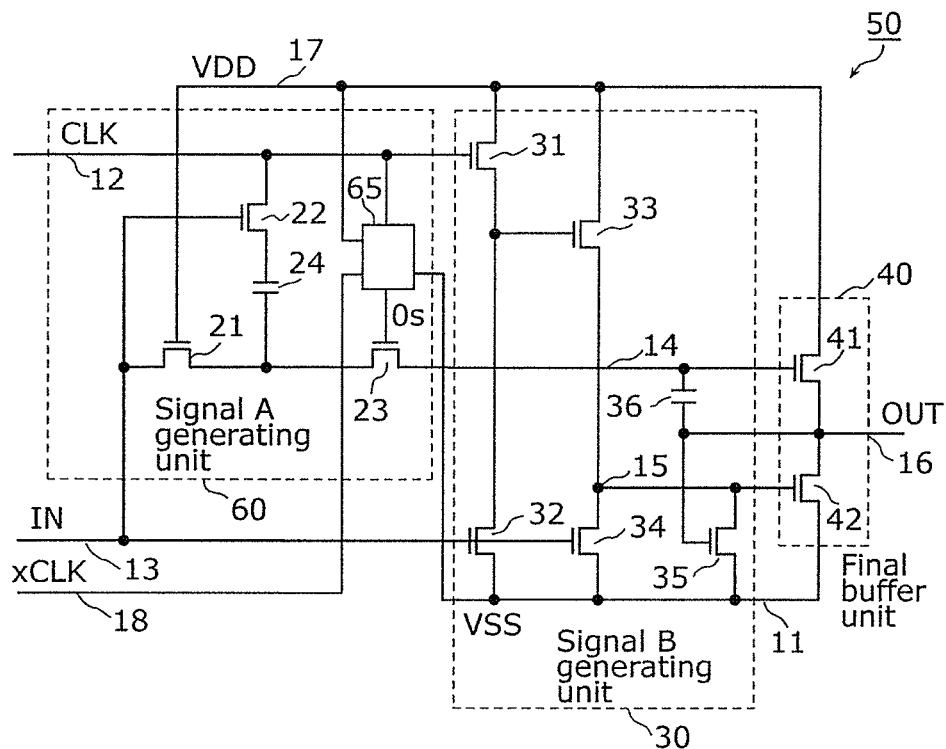
FIG. 5A is an example of a circuit configuration diagram of a shift register according to the embodiment 2.

FIG. 5A is an example of a circuit configuration diagram of a shift register according to the embodiment 2. A unit circuit 50 in FIG. 5A includes a signal A generating unit 60, a signal B generating unit 30, and a final buffer unit 40. The unit circuit 50 included in the shift register according to the embodiment 2 is different from the unit circuit 10 included in the shift register 1 according to the embodiment 1 only in the configuration of the signal A generating unit 60.

The signal A generating unit 60 includes the transistors 21, 22, and 23, the capacitor 24, and a level shifter 65. The signal A generating unit 60 according to the embodiment is different from the signal A generating unit 20 according to the embodiment 1 only in that the level shifter 65 is added. The description identical to the embodiment 1 shall be omitted, and the following only includes description for the difference.

An inverted clock signal xCLK obtained by inverting the clock signal CLK is provided to an inverted clock signal line 18.

The level shifter 65 is connected to the fixed power supply line 17, the reference power supply line 11, the inverted clock signal line 18, the clock signal line 12 and the gate electrode of the transistor 23, and provides an output signal Os obtained by boosting the clock signal CLK to the gate electrode of the transistor 23.

Figure 5B:
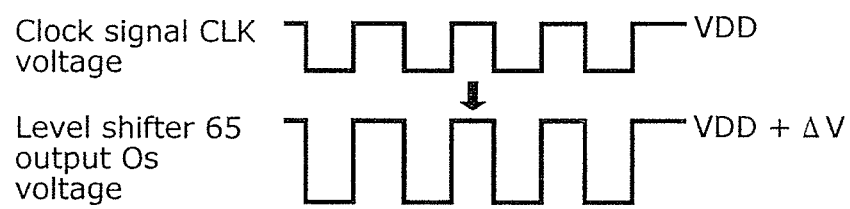
FIG. 5B illustrates an input waveform and an output waveform from the level shifter according to the embodiment 2.

FIG. 5B illustrates an input waveform and an output waveform of the level shifter according to the embodiment 2. As illustrated in FIG. 5B, the level shifter 65 boosts an amplitude (VDD−VSS) of the clock signal CLK which is the input signal so as to generate the output signal Os having an amplitude (VDD−VSS+ΔV).

In the unit circuit 50 illustrated in FIG. 5A, the signal voltage generated by the signal A generating unit 60 is applied to the line A and the gate electrode of the output transistor 41, by a transfer operation of the transistor 23. In this case, the transferred signal voltage level is dependent on the voltage level of the input signal IN, as described in the embodiment 1. The signal voltage is also dependent on a gate voltage of the transistor 23. If the gate voltage of the transistor 23 at the time of transistor is boosted, the signal voltage level transferred increases, allowing a reduction on the on-resistance of the output transistor 41 which is the buffer TFT. As a result, transient characteristics of the output signal OUT is improved. The following shall describe an example of the specific circuit configuration of the level shifter 65.

Figure 6A:
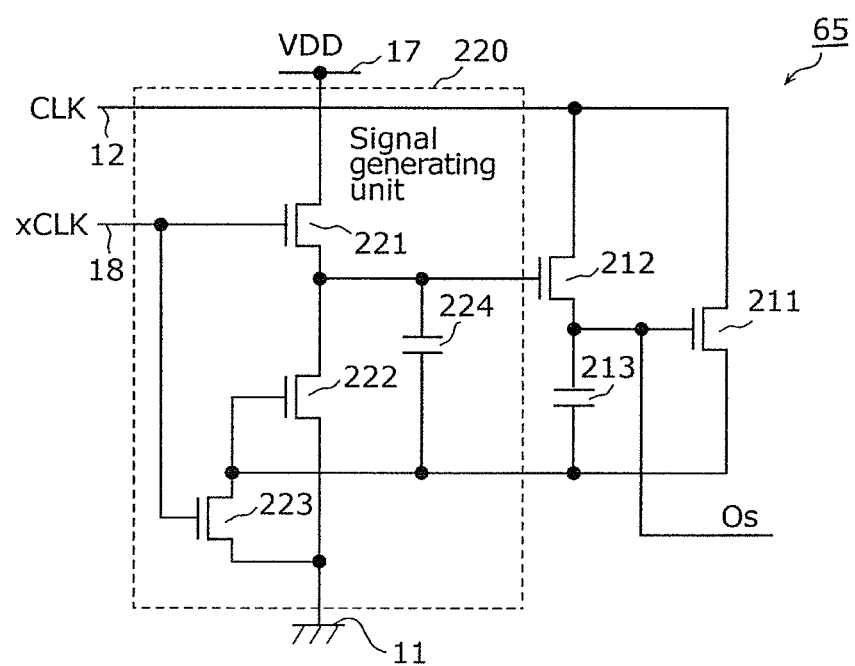
FIG. 6A is an example of a circuit configuration diagram of a level shifter included in the shift register according to the embodiment 2.

FIG. 6A is an example of a circuit configuration diagram of a level shifter included in the shift register according to the embodiment 2. A level shifter 65 in FIG. 6A includes a first transistor 211, a second transistor 212, a capacitor 213, and a signal generating unit 220. The level shifter 65 receives an input of the inverted clock signal xCLK from the inverted clock signal line 18, and shifts the level of the clock signal CLK and outputs the output signal Os to the gate electrode of the transistor 23.

The capacitor 213 has one electrode connected to a source terminal of the first transistor 211, and the other electrode connected to the drain terminal of the second transistor 212, the gate terminal of the first transistor 211, and the gate electrode of the transistor 223. With this, the output level of the level shifter 65 is determined by the potential at the other electrode of the capacitor 213.

A first transistor 211 is the eleventh transistor having a gate terminal connected to the other electrode of the capacitor 213, a drain terminal connected to the clock signal line 12, and a source terminal connected to the one electrode of the capacitor 213 and the signal generating unit 220.

The second transistor 212 is the twelfth transistor having a gate terminal connected to the signal generating unit 220, a drain terminal connected to the clock signal line 12, and a source terminal connected to the other electrode of the capacitor 213 and the gate electrode of the transistor 23.

The signal generating unit 220 includes, for example, transistors 221, 222, and 223, and a capacitor 224, and outputs a predetermined voltage to the gate terminal of the second transistor 212 according to the inverted clock signal xCLK and the clock signal CLK. With this, the potential at the other electrode of the capacitor 213 which determines the output level of the level shifter 65 changes depending on the output from the signal generating unit 220, the input signal IN, and the conduction state of the first transistor 211 and the second transistor 212. The signal generating unit 220 generates a signal for setting the second transistor 212 to the conducting state and supplies the signal to the gate electrode of the second transistor 212 in a period 11 in which the clock signal CLK is in the low level (that is, the inverted clock signal xCLK is in the high level), and generates a signal for switching the second transistor 212 from the conducting state to the non-conducting state, and supplies the signal to the gate electrode of the second transistor 212 in the period 12 in which the clock signal CLK is in the high level. With this, the signal generating unit 220 provides, as an output voltage of the output signal Os, a level-shifted voltage at the other electrode of the capacitor 213 to the gate electrode of the transistor 23 after the second transistor changes to the non-conducting state in the period 12. The following shall describe an example of the connection of the components in the signal generating unit 220.

The transistor 221 has a gate terminal connected to the inverted clock signal line 18, a drain terminal connected to the fixed power supply line 17, and a source terminal connected to the gate terminal of the second transistor 212.

The transistor 222 has a gate terminal connected to the source terminal of the first transistor 211 and the one electrode of the capacitor 213, a drain terminal connected to the source terminal of the transistor 221, and a source terminal connected to a ground terminal.

The transistor 223 has a gate terminal connected to the inverted clock signal line 18, a drain terminal connected to the gate terminal of the transistor 222, and a source terminal connected to the reference power supply line 11.

The capacitor 224 has one electrode connected to the gate terminal of the second transistor 212, the source terminal of the transistor 221, and the drain terminal of the transistor 222, and the other electrode connected to the source terminal of the first transistor 211, the one electrode of the capacitor 213, the gate terminal of the transistor 222, and the drain terminal of the transistor 223.

Note that, the first transistor 211, the second transistor 212, the transistor 221, the transistor 222, and the transistor 223 are made of n-type TFTs, for example. This simplifies the fabrication process of the level shifter, and improves the fabrication yield.

With the circuit configuration of the signal generating unit 220 described above, the signal generating unit 220 sets the second transistor 212 to the conducting state in the reset period, and sets the second transistor 212 from the conducting state to the non-conducting state in the boosting period. The following shall describe specific operation in each period with reference to FIG. 6B.

Figure 6B:
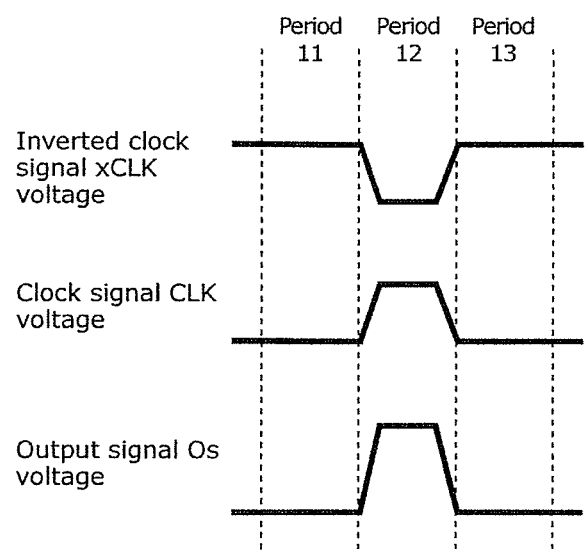
FIG. 6B is a timing chart for driving the level shifter according to the embodiment 2.

FIG. 6B is a timing chart for driving the level shifter according to the embodiment 2. FIG. 6B illustrates voltage levels of the inverted clock signal xCLK, the clock signal CLK, and the output signal Os, which are control signals for driving the level shifter 65. The following shall describe circuit operation in the period 11 to the period 13.

In the period 11, the voltage of the inverted clock signal xCLK is set to the high level. In the period 11, the transistor 221 is set to be in the conducting state when the inverted clock signal xCLK is in the high level. Since transistor 221 is set to be in the conducting state, the one electrode of the capacitor 224 is in the high level. Furthermore, since the inverted clock signal xCLK is in the high level, the transistor 223 is set to be in the conducting state. Since the transistor 223 is set to be in the conducting state and the source terminal of the transistor 223 is connected to the reference power supply line 11, the other electrode of the capacitor 224 is in the low level. With the operation described above, a voltage equivalent to the fixed power supply voltage (a potential difference between the high level and the low level) is charged in the capacitor 224. Accordingly, a high voltage is applied on the gate terminal of the second transistor 212, and thus the second transistor 212 is set to be in the conducting state. To put it differently, in the period 11, the conducting state of the second transistor 212 is maintained until the boosting operation starts by charging the voltage corresponding to the power supply voltage to the capacitor 224. Here, since the low voltage of the clock signal CLK is applied on the output terminal though the second transistor 212, the output signal Os is in the low level.

Next, the high voltage from the clock signal CLK is applied to the output terminal in the period 12. The conducting state of the second transistor 212 is maintained from the period 11. Accordingly, since the clock signal CLK changes to the high voltage, the level of the output signal Os gradually changes to the high level from the low level. Corresponding to this change, the gate voltage of the first transistor 211 gradually increases as well, and so is conductance between the drain and source of the first transistor 211. With this, current gradually starts flowing from the input terminal side to the side of the one electrode of the capacitor 213 through the first transistor 211.

Due to the current from the input terminal side to the side of the one electrode of the capacitor 213 started flowing when the period 12 starts, the high voltage of the clock signal CLK is transmitted to the one electrode of the capacitor 213 in the steady state in the period 12 setting the potential at the electrode to the high level. Subsequently, the high voltage is also applied on the gate terminal of the transistor 222 connected to the one electrode of the capacitor 213, setting the transistor 222 in the conducting state. Here, discharge current flows from the one electrode of the capacitor 224 to the ground terminal through the transistor 222, and the potential at the one electrode of the capacitor 224 and the gate terminal of the second transistor 212 drops from the high level to the low level. With this, the second transistor 212 is set to the non-conducting state.

Here, from a period when the second transistor 212 is set to be in the conducting state and the clock signal CLK changes to the high level at the beginning of the period 12 to a period when the second transistor 212 is set to be in the non-conducting state, the capacitor 213 is charged depending on the high voltage of the clock signal CLK. Here, at a point in time when the second transistor is set to the non-conducting state, the one electrode of the capacitor 213 increases to the high level (denoted as a voltage H), and thus a voltage at the other electrode of the capacitor 213 and the output terminal is (H+$\Delta$V), where LW denotes the charged voltage of the capacitor 213 in the period. Stated differently, in the period 12, by the change of the first transistor 211 to the conducting state, the boosting operation by the capacitor 213 is performed. Furthermore, at the same time, the transistor 222 is set to be in the conducting state, and the second transistor 212 is set to be in the non-conducting state in the process of the boosting operation. The boosting operation is complete in this stage. As a result, the voltage H of the clock signal CLK is boosted to the voltage of the output signal Os (H+$\Delta$V).

Next, in the period 13, the input signal IN has already changed to the low voltage. Due to the potential change in the clock signal CLK, the potentials at the source terminal and the drain terminal of the first transistor 211 are reversed when the period 12 ends, and in the period 13, current flows from the one electrode side of the capacitor 213 to the input terminal side, through the first transistor 211. Due to the flow of the current and that the gate terminal of the first transistor 211 is electrically blocked by the non-conducting state of the second transistor 212 and the capacitor 213, the gate voltage of the first transistor 211 is discharged to the input terminal side. As a result, the voltage at the output signal Os is in the low level.

As described above, the level shifter 65 according to this embodiment includes a capacitor 213 having charging function, the first transistor 211 and the second transistor 212 which determine the potentials of the electrodes of the capacitor 213, and a signal generating unit 220 which controls the conduction state of the second transistor 212, and the inverted clock signal xCLK is supplied with the predetermined timing, thereby allowing to boost the clock signal CLK. Since the level shifter 65 has the configuration described above, a dedicated power supply line for the level shift operation is not necessary. Accordingly, it is possible to reduce the space for the lines and the load on the external circuit. Furthermore, since the circuit is configured such that the second transistor 212 is in a sufficient reverse bias state without using a diode-connection TFT, the second transistor 212 can be securely set to the non-conducting state in the boosting process even if the second transistor 212 has the depletion characteristics. Accordingly, it is possible to suppress the degradation in the boosting characteristics.

As described above, according to the shift register of the second embodiment, the clock signal CLK of one type and the input signal IN for generating the on-voltage in the same period as the desired output period is provided. With this, the charge pumping operation by the signal A generating unit 60 and the sample and hold operation by the signal B generating unit 30 are performed. With this, it is possible to prevent transfer malfunction without voltage reduction each time the transfer of the output signal OUT shifts, allowing an output for a desired output period. Furthermore, it is not necessary to add a clock signal line according to the output period, and it is possible to prevent the increase in the area of the frame region in which the shift register is provided.

Furthermore, since the signal voltage level transferred from the signal A generating unit 60 is dependent on the gate voltage of the transistor 23, the gate voltage of the transistor 23 at the time of transfer is boosted by the level shifter 65. With this, the transferred signal voltage level increases, allowing the reduction on the on-resistance in the output transistor 41 which is a buffer TFT. Accordingly, the transient characteristics of the output signal OUT is improved, improving the transfer efficiency of the signal.

(Embodiment 3)

In this embodiment, the shift register in which the load on the transistor 21 included in the shift register 1 according to the embodiment 1 is reduced shall be described.

Figure 7:
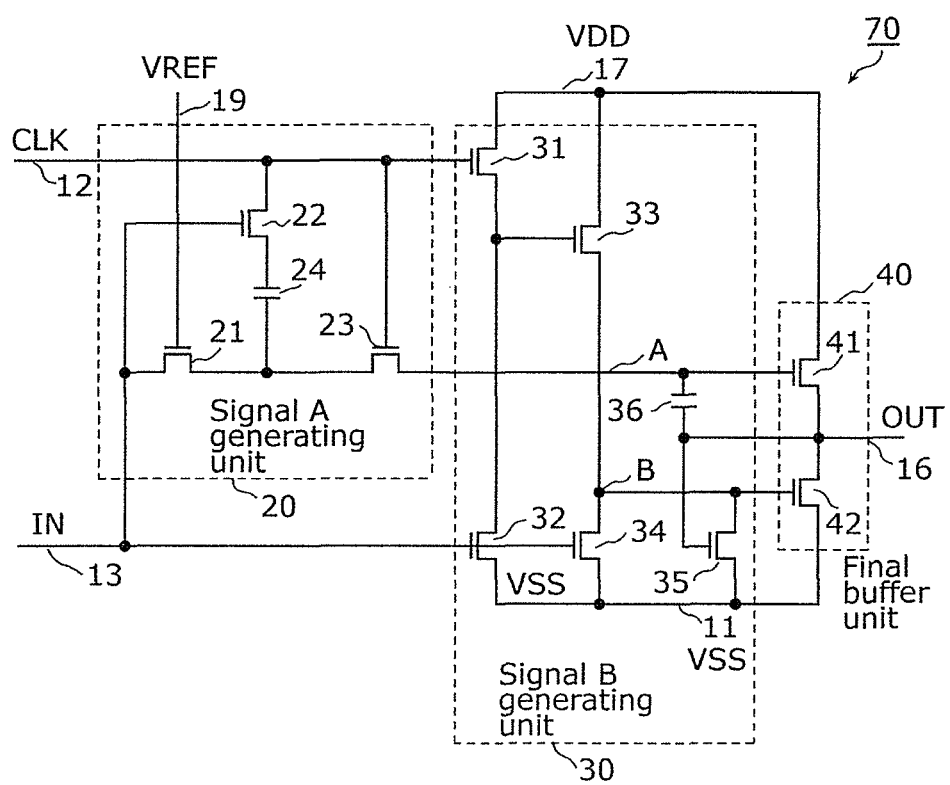
FIG. 7 is an example of a circuit configuration diagram of a shift register according to the embodiment 3.

FIG. 7 is an example of a circuit configuration diagram of the shift register according to the embodiment 3. A unit circuit 70 in FIG. 7 includes a signal A generating unit 20, a signal B generating unit 30, and a final buffer unit 40. The unit circuit 70 according to the embodiment 3 is different from the unit circuit 10 according to the embodiment 1 only in that the reference power supply line 19 for supplying a fixed voltage having an absolute value smaller than the first voltage is connected to the gate electrode of the transistor 21, instead of the fixed power supply line 17. The description identical to the embodiment 1 shall be omitted, and the following includes description for the difference.

Figure 8A:
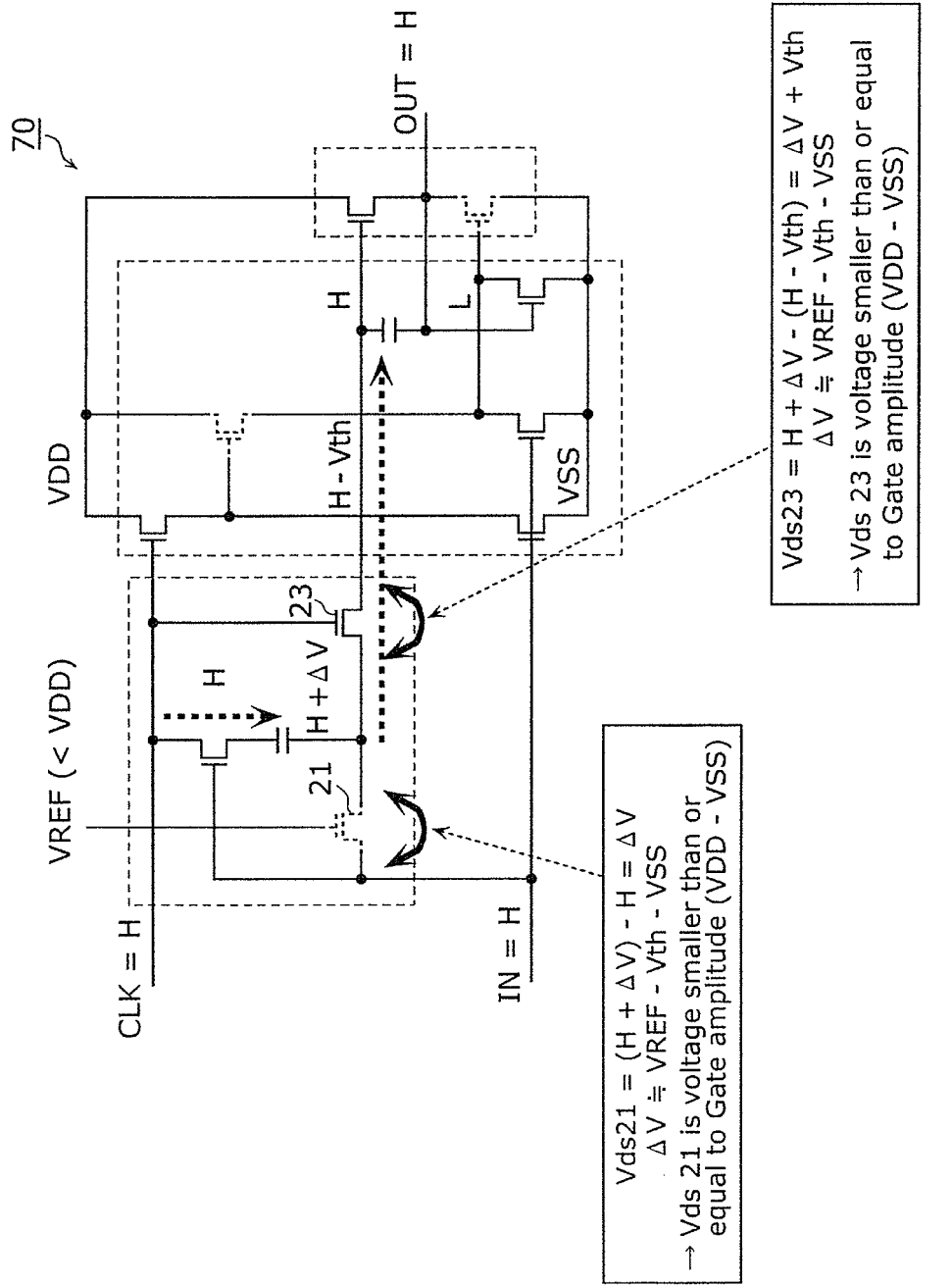
FIG. 8A illustrates effects of the shift register according to the embodiment 3.

FIG. 8A is an example of a circuit configuration diagram of a shift register according to the embodiment 3. FIG. 8B illustrates effects of the shift register according to the embodiment 1. In the unit circuit 10 included in the shift register 1 according to the embodiment 1 illustrated in FIG. 8B, when the signal A generating unit 20 performs the boosting operation in the period 2, the voltage H (VDD) is applied to the gate electrode of the transistor 21, the voltage H (VDD) is applied to the drain electrode, and the voltage (H+$\Delta$V) is applied to the source electrode. In this case, the drain-source voltage Vds 21 in the transistor 21 is $\Delta$V (=(H+$\Delta$V)−H). Since $\Delta$V is (VDD−VSS) at maximum, a large voltage approximately at the gate amplitude (VDD−VSS) is generated as the Vds21. Furthermore, in the transistor 23, the voltage (H+$\Delta$V) is applied to the drain electrode, and the voltage (H−Vth23) is applied to the source electrode, where Vth23 denotes the threshold voltage of the transistor 23. With this, Vds23 is ($\Delta$V+Vth23) (=(H+$\Delta$V)−(H−Vth23)). With this, a large voltage approximately at the gate amplitude (VDD−VSS) is generated as Vds23. Accordingly, large load is exerted on the transistors 21 and 23, which raises concerns such as the shift in threshold voltage and reduction in reliability.

In contrast, in the unit circuit 70 according to the embodiment illustrated in FIG. 8A, when the signal A generating unit 20 performs the boosting operation in the period 2, the reference power supply line 19 for supplying a reference voltage Vref smaller than the power supply voltage VDD is connected to the gate electrode of the transistor 21. With this, Vds in the transistor 21 is ΔV (=(H+ΔV)−H), and ΔV is (Vref−Vth21−VSS). Accordingly, a voltage smaller than the gate amplitude (VDD−VSS) is generated as Vds21. Furthermore, the voltage (H+ΔV) is applied to the drain electrode of the transistor 23, and the voltage (H−Vth23) is applied to the source electrode of the transistor 23. With this, Vds23 is (ΔV+Vth23) (=(H+ΔV)−(H−Vth23). With this, a voltage smaller than the gate amplitude (VDD−VSS) is generated as Vds23.

As described above, by setting the reference voltage Vref supplied from the reference power supply line 19 smaller than the power supply voltage VDD, even when the signal A generating unit 20 performs the boosting operation, Vds at the transistor 21 can be set smaller than the gate amplitude. With this, the load on the transistor 21 is reduced. Accordingly, the shift of the threshold voltage and reduction in reliability can be suppressed.

As described above, according to the unit circuit 70 according to the embodiment 3, by the input of the clock signal CLK of one type and the input signal IN for generating the on-voltage in the same period as the desired output period, the charge pumping operation by the signal A generating unit 60 and the sample and hold operation by the signal B generating unit 30 are performed. With this, it is possible to prevent transfer malfunction without voltage reduction each time the transfer of the output signal OUT shifts, allowing an output for a desired output period. Furthermore, it is not necessary to add a clock signal line according to the output period, and it is possible to prevent the increase in the area of the frame region in which the shift register is provided. Furthermore, the load on the transistor is reduced, improving the reliability.

The description of the shift register according to an aspect of the present disclosure has been made as described above. However, the present disclosure is not limited to the embodiments. Those skilled in the art will readily appreciate that many modifications are possible in the exemplary embodiments without materially departing from the novel teachings and advantages of the present disclosure. Accordingly, all such modifications are intended to be included within the scope of the present disclosure.

Note that, in the embodiments 1 to 3, all of the transistors composing the shift registers are assumed to be the n-type TFTs. However, all of the transistors composing the shift register according to the present disclosure may be p-type TFTs to produce the same effect. The following describes a circuit configuration and driving timing in this case.

Figure 9:
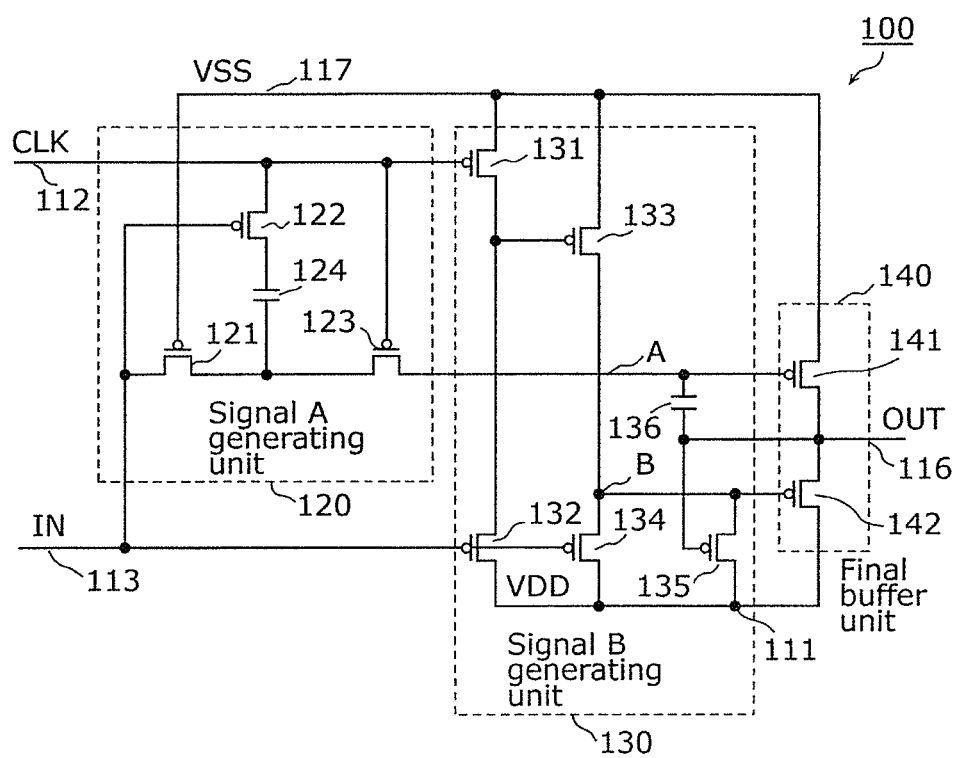
FIG. 9 is a circuit configuration diagram illustrating a variation of the shift register according to the embodiment 1.

FIG. 9 is an example of a variation of a circuit configuration diagram of the shift register according to the embodiment 1. The unit circuit 100 according to FIG. 9 includes a signal A generating unit 120, a signal B generating unit 130, and a final buffer unit 140.

The circuit configuration of the unit circuit 100 included in the shift register illustrated in FIG. 9 is different from the unit circuit 10 included in the shift register 1 in FIG. 2 in that the conductivity of all of the transistors is p-type, and a connection between the power supply voltage VDD and the ground voltage VSS which is the reference voltage is reversed.

A reference power supply line 117 is set to a reference voltage VSS corresponding to a voltage applied to the scanning line when the scanning line is selected. The fixed power supply line 111 is set to the fixed power supply voltage VDD corresponding to the voltage applied to the scanning line when the scanning line is not selected. The input line 113 is connected to the output line 116 in the unit circuit 100 in the previous stage, and the output signal OUT in the unit circuit 100 in the previous stage is supplied as the input signal IN.

The final buffer unit 140 is an output unit including an output terminal and output transistors 141 and 142.

The output transistor 141 is the first transistor having a source electrode connected to the reference power supply line 117, a drain electrode connected to the output terminal through the output line 116, and a gate electrode connected to the signal A generating unit 120 through the line A.

The output transistor 142 is the second transistor having a source electrode connected to the output terminal through the output line 116, a drain electrode connected to the fixed power supply line 111, and a gate electrode connected to the signal B generating unit 130 through the line B.

The signal A generating unit 120 is the first signal generating unit including transistors 121, 122, and 123 and a capacitor 124.

The transistor 123 is the third transistor having a gate electrode connected to the clock signal line 112, a source electrode connected to the one of electrodes of the capacitor 124, and a drain electrode connected to the gate electrode of the output transistor 141 through the line A.

The transistor 121 is the fourth transistor having a gate electrode connected to the reference power supply line 117, a source electrode connected to the input line 113, and a drain electrode connected to the one of electrodes of the capacitor 124.

The transistor 122 is the fifth transistor having a gate electrode connected to the input line 113, a source electrode connected to the clock signal line 112, and a drain electrode connected to the other of the electrodes of the capacitor 124.

The capacitor 124 is the first capacitor which has a charge pumping function; that is, which holds a potential difference between the clock signal CLK and the input signal IN when the transistors 121 and 122 are set to be in the conducting state, and boosts the signal voltage to be supplied to the line A according to the potential difference.

With the configuration described above, the signal A generating unit 120 boosts the voltage of the input signal IN so as to prevent attenuation of the input signal IN due to multiple-stage connection of the unit circuits 100, and supplies a first signal for switching the output transistor 141 between conduction and non-conduction to the gate electrode of the output transistor 141, based on the input signal IN. Furthermore, transistors connected in series are not provided between the reference power supply line 117 and the fixed power supply line 111. Accordingly, even if the transistors 121 to 123 are of depletion type, it is possible to prevent flow-through current flowing from the fixed power supply line 111 to the reference power supply line 117 from flowing.

The signal B generating unit 130 is the second signal generating unit including transistors 131 to 135 and a capacitor 136.

The transistor 131 is the seventh transistor having a gate electrode connected to the clock signal line 112, a source electrode connected to the reference power supply line 117, and a drain electrode connected to the gate electrode of the transistor 133, and switches the transistor 133 between conduction and non-conduction corresponding to the clock signal CLK.

The transistor 132 is the eighth transistor having a gate electrode connected to the input line 113, a source electrode connected to a gate electrode of the transistor 133, and a drain electrode connected to the fixed power supply line 111, and switches the transistor 133 between conduction and non-conduction according to the input signal IN. The transistor 133 is the sixth transistor having a source electrode connected to the reference power supply line 117, a drain electrode connected to the gate electrode of the output transistor 142 through the line B, and switches the output transistor 142 between conduction and non-conduction according to the conduction state of the transistors 131 and 132.

The transistor 134 is the ninth transistor having a gate electrode connected to the input line 113, a source electrode connected to the gate electrode of the transistor 142 through the line B, and a drain electrode connected to the fixed power supply line 111, and switches the output transistor 142 between conduction and non-conduction according to the input signal IN.

The transistor 135 is the tenth transistor having a gate electrode connected to the output terminal through the output line 116, a source electrode connected to the gate electrode of the output transistor 142 through the line B, and a drain electrode connected to the fixed power supply line 111, and switches the output transistor 142 between conduction and non-conduction according to the output signal OUT.

The capacitor 136 is the second capacitor having one electrode connected to the gate electrode of the output transistor 141 through the line A, and the other electrode connected to the output terminal through the output line 116.

With the configuration described above, the signal B generating unit 130 supplies, based on the input signal IN, a second signal for switching the output transistor 142 between conduction and non-conduction to the gate electrode of the output transistor 142, and holds the voltage at the line A and the gate electrode of the output transistor 141.

The shift register including the unit circuits 100 described above produces the same effects as the shift register 1 including the unit circuits 10.

Figure 10:
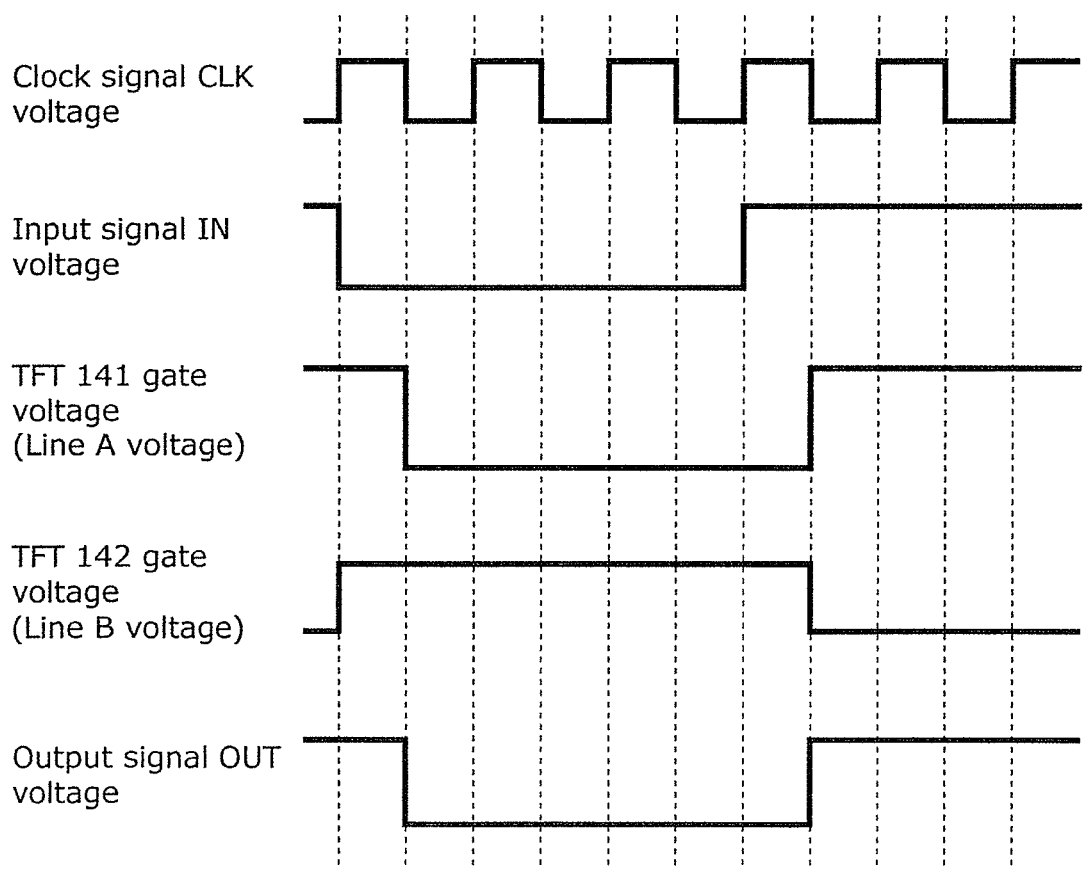
FIG. 10 is a timing chart for driving a variation of the level shifter according to the embodiment 1.
Figure 11A:
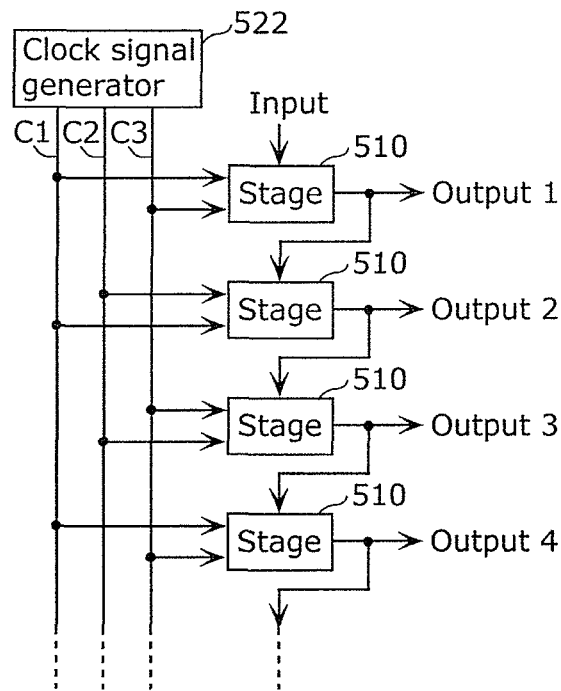
FIG. 11A is a block configuration diagram of the shift register disclosed in the patent literature 1.
Figure 11B:
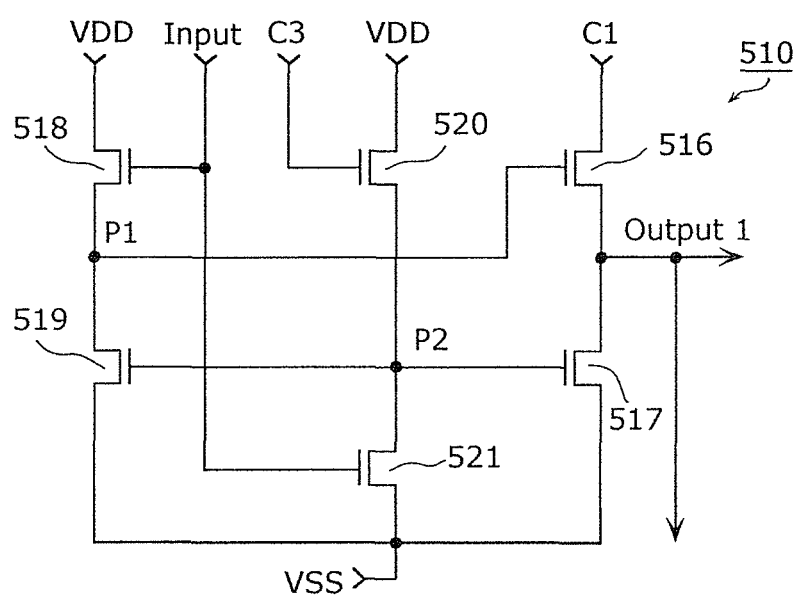
FIG. 11B is a specific circuit configuration diagram of a stage included in the shift register disclosed in the patent literature 1.

FIG. 10 is a driving timing chart illustrating a variation of the shift register according to the embodiment 1. The driving timing in FIG. 10 is different from the driving timing in FIG. 3 only in that the voltage levels of the signals are inverted, and the circuit operation of each signal is identical to the circuit operation of the shift register 1 according to the embodiment 1.

Since the unit circuit 100 includes the transistors 121 to 123, 131 to 135, and the output transistors 141 and 142 made of p-type TFT, the fabrication process of the shift register is simplified, improving the fabrication yield.

Industrial Applicability

The shift register disclosed herein is useful for technical fields such as displays for flat-screen televisions and personal computers which require large screens and high definition.

The invention claimed is:

1. A shift register including a plurality of unit circuits connected in multiple stages,
wherein each of the unit circuits includes:
an output unit having an output terminal, a first transistor which supplies a first voltage to the output terminal, and a second transistor which supplies a second voltage to the output terminal;
a first signal generating unit configured to supply a first signal for switching the first transistor between conduction and non-conduction to a gate electrode of the first transistor, based on an input signal which is a signal provided from an output terminal of a unit circuit in a previous stage and a clock signal; and
a second signal generating unit configured to supply a second signal for switching the second transistor between conduction and non-conduction to a gate electrode of the second transistor, based on the input signal and the clock signal,
the first signal generating unit includes:
a first capacitor;
a third transistor having a gate electrode connected to a clock signal line to which the clock signal is provided, and which switches conduction and non-conduction between the gate electrode of the first transistor and one of electrodes of the first capacitor;
a fourth transistor having a gate electrode connected to an input line to which the input signal is provided, and which switches conduction and non-conduction between the other of the electrodes of the first capacitor and the clock signal line; and
a fifth transistor having a gate electrode connected to a reference power supply line, and which switches conduction and non-conduction between the one electrode of the first capacitor and the input line.

2. The shift register according to claim 1,
wherein the first capacitor holds a potential difference between the clock signal and the input signal when the fourth transistor and the fifth transistor are in a conducting state,
a potential in the one electrode of the first capacitor is boosted using a potential change of the clock signal when the fourth transistor is in the conducting state, and
the first signal generating unit supplies, to the first transistor, the first signal obtained by boosting the input signal according to the potential difference and the potential change.

3. The shift register according to claim 1,
wherein the second signal generating unit includes:
a sixth transistor which switches conduction and non-conduction between a first fixed power supply line and the gate electrode of the second transistor, the first fixed power supply line being for supplying a first fixed voltage corresponding to the first voltage;
a seventh transistor having a gate electrode connected to the clock signal line, and which switches conduction and non-conduction between the first fixed power supply line and a gate electrode of the sixth transistor;
an eighth transistor having a gate electrode connected to the input line, and which switches conduction and non-conduction between the gate electrode of the sixth transistor and a second fixed power supply line for supplying a second fixed voltage corresponding to the second voltage;
a ninth transistor having a gate electrode connected to the input line, and which switches conduction and non-conduction between the gate electrode of the second transistor and the second fixed power supply line; and
a tenth transistor having a gate electrode connected to the gate electrode of the first transistor through a second capacitor, and which switches conduction and non-conduction between the gate electrode of the second transistor and the second fixed power supply line, and
the second signal generating unit supplies, to the gate electrode of the second transistor, the second signal for setting the second transistor to a non-conducting state at least in a period when the first transistor is in a conducting state by the first signal supplied by the first signal generating unit.

4. The shift register according to claim 3,
wherein the first to the tenth transistors are n-type thin-film transistors.

5. The shift register according to claim 3,
wherein the first to the tenth transistors are p-type thin-film transistors.

6. The shift register according to claim 1, further comprising
a level shifter circuit which is provided between a gate electrode of the third transistor and the clock signal line, and shifts a level of a signal voltage of the clock signal and provides the level-shifted signal voltage to the gate electrode of the third transistor.

7. The shift register according to claim 6,
wherein the level shifter circuit includes:
an input terminal connected to the clock signal line and to which an input pulse voltage of the clock signal is applied;
a third capacitor;
an eleventh transistor having a source electrode and a drain electrode which are provided between the input terminal and one of electrodes of the third capacitor, and a gate electrode connected to the other of the electrodes of the third capacitor;
a twelfth transistor having a source electrode and a drain electrode provided between the input terminal and the other electrode of the third capacitor;
a signal generating unit configured to generate a signal for switching the twelfth transistor from a conducting state to a non-conducting state and to supply the generated signal to a gate electrode of the twelfth transistor, in a period when the input pulse voltage is provided to the input terminal; and
an output terminal connected to the gate electrode of the eleventh transistor and for providing a voltage of the other electrode of the third capacitor converted as a result of the twelfth transistor being in the non-conducting state in the period as an output pulse voltage.

8. The shift register according to claim 7,
wherein the eleventh transistor and the twelfth transistor are n-type thin-film transistors.

9. The shift register according to claim 7,
wherein the eleventh transistor and the twelfth transistor are p-type thin-film transistors.

10. The shift register according to claim 1,
wherein the reference power supply line is for supplying a first fixed voltage corresponding to the first voltage.

11. The shift register according to claim 1,
wherein the reference power supply line is for supplying a fixed voltage having an absolute value smaller than the first voltage.

* * * * *